United States Patent
Arikan

(10) Patent No.: US 11,271,593 B2
(45) Date of Patent: Mar. 8, 2022

(54) METHODS AND APPARATUS FOR SYSTEMATIC ENCODING OF DATA IN ERROR CORRECTION CODING USING TRIANGULAR FACTORIZATION OF GENERATOR MATRIX

(71) Applicant: Polaran Haberlesme Teknolojileri Anonim Sirketi, Ankara (TR)

(72) Inventor: Erdal Arikan, Ankara (TR)

(73) Assignee: POLARAN YAZILIM BILISIM DANISMANLIK ITHALATIHRACAT SANAYI TICARET LIMITED SIRKETI, Cankaya/Ankara (TR)

( * ) Notice: Subject to any disclaimer, the term of this patent is extended or adjusted under 35 U.S.C. 154(b) by 132 days.

(21) Appl. No.: 16/700,972

(22) Filed: Dec. 2, 2019

(65) Prior Publication Data

US 2021/0167797 A1 Jun. 3, 2021

(51) Int. Cl.
*H03M 13/11* (2006.01)
*H03M 13/15* (2006.01)
*H03M 13/00* (2006.01)
*H03M 13/23* (2006.01)

(52) U.S. Cl.
CPC ...... *H03M 13/118* (2013.01); *H03M 13/1137* (2013.01); *H03M 13/156* (2013.01); *H03M 13/235* (2013.01); *H03M 13/616* (2013.01)

(58) Field of Classification Search
CPC .............. H03M 13/118; H03M 13/156; H03M 13/235; H03M 13/616; H03M 13/1137
See application file for complete search history.

(56) References Cited

U.S. PATENT DOCUMENTS

| | | | |
|---|---|---|---|
| 8,347,186 B1 | 1/2013 | Arikan | |
| 2019/0165887 A1 | 5/2019 | Arikan | |
| 2020/0280740 A1* | 9/2020 | Tsukuba | ............... H04N 19/426 |
| 2020/0412385 A1* | 12/2020 | Arikan | ............... H03M 13/2906 |

OTHER PUBLICATIONS

International Search Report dated Feb. 12, 2021 in connection with International Patent Application No. PCT/IB2020/060726, 2 pages.
Written Opinion of the International Searching Authority dated Feb. 12, 2021 in connection with International Patent Application No. PCT/IB2020/060726, 5 pages.

(Continued)

*Primary Examiner* — Phung M Chung

(57) ABSTRACT

A systematic encoder reliably transferring a source data block (SDB) is configured for an outer transform matrix and an inner transform matrix. An inner encoder receives the SDB and generates an output constraint block (OCB) as an SDB image under an inverse of a submatrix of the inner transform matrix. An outer encoder receives a fixed data block (FDB) and the OCB and generates a transform output block (TOB) as a transform input block (TIB) image under the outer transform matrix. The TIB contains the FDB transparently in a sub-block of the TIB, and the TOB contains the OCB transparently in a sub-block of the TOB. The inner encoder receives the TOB and generates a transmitted code block (TCB), transparently containing the SDB in a sub-block therein.

12 Claims, 16 Drawing Sheets

(56) References Cited

OTHER PUBLICATIONS

E. Arikan, "Channel Polarization: A Method for Constructing Capacity-Achieving Codes for Symmetric Binary-Input Memoryless Channels," IEEE Transactions on Information Theory, vol. 55, No. 7, pp. 3051-3073, Jul. 2009.

E. Arikan, "Systematic Polar Coding," IEEE Communications Letters, vol. 15, No. 8, pp. 860-862, Aug. 2011.

E. Arikan, "Methods and Apparatus for Error Correction Coding with Triangular Factorization of Generator Matrix," U.S. Appl. No. 16/453,887, 84 pages, Jun. 26, 2019.

E. Arikan, "From sequential decoding to channel polarization and back again," arXiv:1908.09594 [cs, IT], 10 pages, Aug. 26, 2019.

C. Berrou, et al., "Near optimum error correcting coding and decoding: turbo-codes," IEEE Transactions on Communications, vol. 44, No. 10, pp. 1261-1271, Oct. 1996.

G. T. Chen, et al., "A Low Complexity Encoding Algorithm for Systematic Polar Codes," IEEE Communications Letters, vol. 20, No. 7, pp. 1277-1280, Jul. 2016.

P. Elias, "Error-free Coding," Transactions of the IRE Professional Group on Information Theory, vol. 4, No. 4, pp. 29-37, Sep. 1954.

R1-167209, Polar code design and rate matching, Huawei, HiSilicon, 3GPP TSG RAN WG1 Meeting #86, Gothenburg, Sweden, 5 pages, Aug. 22-26, 2016.

G. Sarkis, et al., "Fast Polar Decoders: Algorithm and Implementation," IEEE Journal on Selected Areas in Communications, vol. 32, No. 5, pp. 946-957, May 2014.

G. Sarkis, et al., "Flexible and Low-Complexity Encoding and Decoding of Systematic Polar Codes," IEEE Transactions on Communications, vol. 64, No. 7, pp. 2732-2745, Jul. 2016.

R. Wang, et al., "A Novel Puncturing Scheme for Polar Codes," IEEE Communications Letters, vol. 18, No. 12, pp. 2081-2084, Dec. 2014.

H. Vangala, et al., "Efficient Algorithms for Systematic Polar Encoding," IEEE Communications Letters, vol. 20, No. 1, pp. 17-20, Jan. 2016.

D. Commenges, et al., "Fast inversion of triangular Toeplitz matrices," IEEE Transactions on Automatic Control, vol. 29, No. 3, pp. 250-251, Mar. 1984.

A. V. Oppenheim, et al., Digital Signal Processing, Prentice-Hall, Englewood Cliffs, New Jersey, 3 pages, 1975.

* cited by examiner exemplary calculation 450 for the IUT encoding method 400 ↙

451

| $i$ | $j$ | $k$ | $b_i$ | $a_j$ | $\gamma_k$ | $s$ | $a_j+s$ | $\gamma_k-s$ | $v_i$ | $w_i$ |
|---|---|---|---|---|---|---|---|---|---|---|
| 1 | 1 | 1 | 0 | 0 | 0 | 0 | 0 | 0 | 0 | 0 |
| 2 | 2 | 1 | 0 | 0 | 0 | 0 | 0 | 0 | 0 | 0 |
| 3 | 3 | 1 | 0 | 0 | 0 | 0 | 0 | 0 | 0 | 0 |
| 4 | 4 | 1 | 1 | 1 | 0 | 0 | 1 | 0 | 0 | 0 |
| 5 | 5 | 2 | 0 | 1 | 0 | 0 | 1 | 0 | 1 | 1 |
| 6 | 5 | 2 | 1 | 1 | 0 | 1 | 0 | 0 | 0 | 0 |
| 7 | 5 | 3 | 0 | 1 | 1 | 0 | 1 | 1 | 1 | 0 |
| 8 | 5 | 3 | 1 | 1 | 1 | 0 | 1 | 1 | 1 | 1 |

$$U = \begin{bmatrix} 1 & 1 & 1 & 0 & 1 & 0 & 1 & 1 \\ 0 & 1 & 1 & 0 & 0 & 0 & 0 & 1 \\ 0 & 0 & 1 & 1 & 1 & 0 & 1 & 1 \\ 0 & 0 & 0 & 1 & 1 & 0 & 1 & 1 \\ 0 & 0 & 0 & 0 & 1 & 0 & 1 & 1 \\ 0 & 0 & 0 & 0 & 0 & 1 & 1 & 1 \\ 0 & 0 & 0 & 0 & 0 & 0 & 1 & 1 \\ 0 & 0 & 0 & 0 & 0 & 0 & 0 & 1 \end{bmatrix}$$

452 ↗

$b=(0,0,0,1,0,1,0,1)$  $a=(0,0,0,1,1)$  $\gamma=(0,0,1)$  $v=(0,0,0,0,1,0,1,1)$  $w=(0,0,0,0,1,0,0,1)$ 453    454    455    456    457

FIGURE 4B exemplary calculation 550 for the IUT Toeplitz encoding method 500

| $i$ | $j$ | $k$ | $b_i$ | $a_j$ | $\gamma_k$ | $r_1$ | $r_2$ | $r_3$ | $s$ | $a_j+s$ | $\gamma_k-s$ | $v_i$ | $w_i$ |
|---|---|---|---|---|---|---|---|---|---|---|---|---|---|
| 1 | 1 | 1 | 0 | 0 | 0 | 0 | 0 | 0 | 0 | 0 | 0 | 0 | 0 |
| 2 | 2 | 1 | 0 | 0 | 0 | 0 | 0 | 0 | 0 | 0 | 0 | 0 | 0 |
| 3 | 3 | 1 | 0 | 0 | 0 | 0 | 0 | 0 | 0 | 0 | 0 | 0 | 0 |
| 4 | 4 | 1 | 1 | 1 | 0 | 1 | 0 | 0 | 0 | 1 | 0 | 0 | 0 |
| 5 | 5 | 2 | 0 | 1 | 0 | 1 | 0 | 0 | 0 | 1 | 0 | 0 | 1 |
| 6 | 5 | 2 | 1 | 1 | 1 | 1 | 1 | 0 | 1 | 0 | 1 | 1 | 0 |
| 7 | 5 | 3 | 0 | 1 | 0 | 1 | 1 | 0 | 1 | 0 | 0 | 1 | 0 |
| 8 | 5 | 3 | 1 | 1 | 1 | 1 | 1 | 1 | 0 | 1 | 1 | 1 | 1 |

$$U = \begin{bmatrix} 1 & 1 & 0 & 1 & 0 & 0 & 0 & 0 \\ 0 & 1 & 1 & 0 & 1 & 0 & 0 & 0 \\ 0 & 0 & 1 & 1 & 1 & 1 & 0 & 0 \\ 0 & 0 & 0 & 1 & 0 & 1 & 1 & 0 \\ 0 & 0 & 0 & 0 & 1 & 1 & 0 & 1 \\ 0 & 0 & 0 & 0 & 0 & 1 & 1 & 0 \\ 0 & 0 & 0 & 0 & 0 & 0 & 1 & 1 \\ 0 & 0 & 0 & 0 & 0 & 0 & 0 & 1 \end{bmatrix}$$

$b=(0,0,0,1,0,1,0,1)$   $a=(0,0,0,1,1)$   $\gamma=(0,0,1)$   $v=(0,0,0,0,1,1,1,1)$   $w=(0,0,0,0,1,0,0,1)$

FIGURE 5B exemplary calculation 950 for the IUT Toeplitz transpose-form encoding method 900

951

| i | j | k | $b_i$ | $a_j$ | $\gamma_k$ | $r_1$ | $r_2$ | $r_3$ | $a_j+r_1$ | $\gamma_k-r_1$ | $v_i$ | $w_i$ |
|---|---|---|---|---|---|---|---|---|---|---|---|---|
| 1 | 1 | 1 | 0 | 0 | 0 | 0 | 0 | 0 | 0 | 0 | 0 | 0 |
| 2 | 2 | 1 | 0 | 0 | 0 | 0 | 0 | 0 | 0 | 0 | 0 | 0 |
| 3 | 3 | 1 | 0 | 0 | 0 | 0 | 0 | 0 | 0 | 0 | 0 | 0 |
| 4 | 4 | 1 | 1 | 1 | 0 | 0 | 0 | 0 | 1 | 0 | 0 | 0 |
| 5 | 5 | 2 | 0 | 1 | 0 | 1 | 0 | 0 | 0 | 1 | 1 | 1 |
| 6 | 5 | 2 | 1 | 1 | 0 | 1 | 1 | 0 | 0 | 1 | 1 | 0 |
| 7 | 5 | 3 | 0 | 1 | 1 | 1 | 1 | 1 | 1 | 1 | 1 | 0 |
| 8 | 5 | 3 | 1 | 1 | 1 | 1 | 1 | 1 | 1 | 1 | 1 | 1 |

952

$$U = \begin{bmatrix} 1 & 1 & 0 & 1 & 0 & 0 & 1 & 0 \\ 0 & 1 & 1 & 0 & 1 & 0 & 1 & 0 \\ 0 & 0 & 1 & 1 & 0 & 1 & 0 & 1 \\ 0 & 0 & 0 & 1 & 1 & 0 & 1 & 0 \\ 0 & 0 & 0 & 0 & 1 & 1 & 0 & 1 \\ 0 & 0 & 0 & 0 & 0 & 1 & 1 & 0 \\ 0 & 0 & 0 & 0 & 0 & 0 & 1 & 1 \\ 0 & 0 & 0 & 0 & 0 & 0 & 0 & 1 \end{bmatrix}$$

953 $\quad$ 954 $\quad$ 955 $\quad$ 956 $\quad$ 957

$b=(0,0,0,1,0,1,0,1) \quad a=(0,0,0,1,1) \quad \gamma=(0,0,1) \quad v=(0,0,0,0,1,1,1,1) \quad w=(0,0,0,0,1,0,0,1)$

FIGURE 9B

METHODS AND APPARATUS FOR SYSTEMATIC ENCODING OF DATA IN ERROR CORRECTION CODING USING TRIANGULAR FACTORIZATION OF GENERATOR MATRIX

TECHNICAL FIELD

The present disclosure is directed generally to methods and apparatus for systematic encoding of data in a communication system, more specifically, to systematic encoding of data using triangular factorization of generator matrix.

BACKGROUND

In modern digital data transmission (wireless telephony, wireless data transmission, optical disk transmission to a player, music players receiving music data, and so on), a channel encoder can receive a source data block (SDB) and add redundancy to it (by passing the SDB through a transformation) to produce a transmitted code block (TCB) that is better protected against noise in a transmission channel than the SDB from which it is derived. A receiver at the other end of the transmission channel receives a received code block (RCB), which is a version of the TCB corrupted by channel noise and/or distortion, and uses a channel decoder to produce from the RCB a decoded source data block (DSDB). The DSDB is then forwarded to a destination, e.g., a music player, which plays the decoded data as audio, or a storage device, which stores the decoded data as a file.

A frame error is said to occur if the DSDB is not an identical copy of the SDB. A generally accepted design goal for channel coding is to reduce the frame error rate (FER) to acceptable levels. A second measure of performance for channel coding is the symbol error rate (SER), which is the average number of symbols (coordinates) in which the DSDB differs from the SDB. If the data symbols are binary, the term bit error rate (BER) is used instead of SER. Channel codes that reduce the FER/SER at the cost of too much computation are of little practical use. In prior art, there exist many classes of channel encoders, such as linear block encoders, that are able to achieve an acceptable tradeoff between the FER/SER and complexity of implementation.

One type of encoder for a linear block code is a non-systematic encoder, which encodes the SDB into the TCB by multiplying the SDB by a generator matrix. In non-systematic encoding the SDB is not guaranteed to appear transparently as part of the TCB. An alternative method of encoding is systematic encoding, in which the SDB is guaranteed to appear transparently as part of the TCB.

Systematic encoding provides several advantages over non-systematic encoding. First, having the SDB appear transparently as part of the TCB may be a system requirement, rather than on option. Second, systematic encoding typically improves the SER/BER performance, without causing a degradation in the FER performance. Third, systematic encoding makes it possible to bypass the decoding function when "hard-decisions" on the RCB yield a valid TCB (where the validity may be verified by checking if certain parity-checks are satisfied). Bypassing the decoder saves energy, which is important in battery operated devices. Fourth, systematic encoding is a necessity in some coding schemes, such as turbo coding [BER1996], where iterative decoding methods are employed that rely on systematic encoding for their operation.

The present disclosure provides systematic encoding methods for triangular factorization (TF) codes, which is a newer type of linear block code disclosed in [ARI2019b]. TF codes are based on a triangular factorization of a code generator matrix into an outer transform matrix and an inner transform matrix. In one embodiment of TF codes, the outer transform matrix is an invertible upper-triangular (IUT) matrix and the inner transform matrix is an invertible lower-triangular (ILT) matrix. A more specific embodiment of TF codes is polarization adjusted convolutional (PAC) code, also introduced in [ARI2019b] and further discussed in [ARI2019c].

There are no methods in prior art specifically designed for systematic encoding of TF codes or PAC codes. The present disclosure provides systematic encoding methods for TF codes and their various embodiments, such as PAC codes. The systematic encoding methods provided herein take advantage of the special properties of TF codes and their various embodiments in order to reduce the complexity of systematic encoding.

In PAC codes, the outer transform matrix is an IUT Toeplitz matrix. The IUT Toeplitz outer transform matrix of a PAC code gives rise to an irregular convolutional code. Convolutional codes are a well-known class of error correcting codes introduced by Elias [ELI1954]. Irregular convolutional codes are a generalization of convolution codes in which the number of source bits accepted into the encoder varies with time in accordance with a polarization phenomenon [ARI2009b]. Systematic encoders for irregular convolutional codes are a novelty of the present disclosure with no counterpart in the prior art.

In PAC codes, the inner transform matrix a polar transform, which is a type of transform introduced in [ARI2009] in connection with polar codes. Polar codes are a class of codes that are able to achieve channel capacity by low-complexity encoding and decoding algorithms [ARI2009]. Systematic encoding of polar codes was first discussed in [ARI2011]. Recursive methods for carrying out systematic encoding of polar codes in a low-complexity manner have been disclosed in [ARI2013]. Specific methods that utilize the recursive principles in [ARI2013] for systematic polar encoding appeared in [CHE2016], [SAR2014], [SAR2016], [WAN2014].

Prior art methods on systematic encoding of polar codes cannot be used directly as part of systematic encoding of PAC codes. Unlike polar codes, the input to the polar transform in PAC coding is not guaranteed to have any frozen symbols. In fact, as explained in [ARI2009c], the main motivation for PAC coding is to avoid fixing any coordinate of the polar transform input so as to avoid loss of channel capacity.

The present principles provide methods for systematic encoding for any inner transform that can be represented as an ILT matrix, which is a broader class of inner transforms than the class of polar transforms. This is another aspect of the present principles that differs from the prior art on systematic encoding of polar codes.

In addition to systematic encoding, the present principles can be used for shortening of TF codes and PAC codes. Shortening is a method of adjusting the block length of a given code. Prior art on polar codes, such as [HUA2016], [WAN2014], [ARI2019a], show how shortening and systematic encoding can be implemented. Similar methods can be applied to integrate shortening into the systematic encoding of TF codes in accordance with the present principles.

REFERENCES

[ARI2009] E. Arikan, "Channel Polarization: A Method for Constructing Capacity-Achieving Codes for Symmetric Binary-Input Memoryless Channels," *IEEE Transactions on Information Theory*, vol. 55, no. 7, pp. 3051-3073, July 2009.

[ARI2011] E. Arikan, "Systematic Polar Coding," *IEEE Communications Letters*, vol. 15, no. 8, pp. 860-862, August 2011.

[ARI2013] E. Arikan, "Method and system for error correction in transmitting data using low complexity systematic encoder," U.S. Pat. No. 8,347,186 B1, 1 Jan. 2013.

[ARI2019a] E. Arikan, "Method and system for error correction in transmitting data using low complexity systematic encoder," U.S. Patent Publication No. 20190165887, 30-05-2019.

[ARI2019b] E. Arikan, "Methods and apparatus for error correction coding with triangular factorization of generator matrix," U.S. patent application Ser. No. 16/453,887, 84 pages 26 Jun. 2019.

[ARI2019c] E. Arikan, "From sequential decoding to channel polarization and back again," arXiv:1908.09594 [cs, IT], 26 Aug. 2019.

[BER1996] C. Berrou and A. Glavieux, "Near optimum error correcting coding and decoding: turbo-codes," *IEEE Transactions on Communications*, vol. 44, no. 10, pp. 1261-1271, October 1996.

[CHE2016] G. T. Chen, Z. Zhang, C. Zhong, and L. Zhang, "A Low Complexity Encoding Algorithm for Systematic Polar Codes," *IEEE Communications Letters*, vol. 20, no. 7, pp. 1277-1280, July 2016.

[ELI1954] P. Elias, "Error-free Coding," *Transactions of the IRE Professional Group on Information Theory*, vol. 4, no. 4, pp. 29-37, September 1954.

[HUA2016] R1-167209, Polar code design and rate matching, Huawei, HiSilicon, 3GPP TSG RAN WG1 Meeting #86, Gothenburg, Sweden, Aug. 22-26, 2016.

[SAR2014] G. Sarkis, P. Giard, A. Vardy, C. Thibeault, and W. J. Gross, "Fast Polar Decoders: Algorithm and Implementation," *IEEE Journal on Selected Areas in Communications*, vol. 32, no. 5, pp. 946-957, May 2014.

[SAR2016] G. Sarkis, I. Tal, P. Giard, A. Vardy, C. Thibeault, and W. J. Gross, "Flexible and Low-Complexity Encoding and Decoding of Systematic Polar Codes," *IEEE Transactions on Communications*, vol. 64, no. 7, pp. 2732-2745, July 2016.

[WAN2014] R. Wang and R. Liu, "A Novel Puncturing Scheme for Polar Codes," *IEEE Communications Letters*, vol. 18, no. 12, pp. 2081-2084, December 2014.

[WAN2016] H. Vangala, Y. Hong, and E. Viterbo, "Efficient Algorithms for Systematic Polar Encoding," *IEEE Communications Letters*, vol. 20, no. 1, pp. 17-20, January 2016.

The above-listed publications are incorporated herein by reference.

SUMMARY

A systematic encoder apparatus for use in a communication system for reliable transfer of a source data block (SDB) is configured for an outer transform matrix and an inner transform matrix. Within the systematic encoder apparatus, an inner encoder is configured to receive the SDB and generate an output constraint block (OCB) as an image of the SDB under an inverse of a submatrix of the inner transform matrix, and an outer encoder is configured to receive a fixed data block (FDB) and the OCB and generate a transform output block (TOB) as an image of a transform input block (TIB) under the outer transform matrix, the TIB containing the FDB transparently in a sub-block of the TIB, the TOB containing the OCB transparently in a sub-block of the TOB. The inner encoder is further configured to receive the TOB and generate a transmitted code block (TCB), the TCB containing the SDB transparently in a sub-block of the TCB. The outer transform matrix is optionally an invertible upper triangular (IUT) matrix. The sub-block of the TOB optionally comprises elements of the TOB whose indices belong to an index set, and the sub-block of the TIB optionally comprises elements of the TIB whose indices belong to a complement of the index set. The inner transform matrix is optionally an invertible lower triangular (ILT) matrix, with the submatrix of the inner transform matrix comprising elements of the inner transform matrix whose row indices belong to the index set and whose column indices belong to the index set, with the sub-block of the TCB comprising elements of the TCB whose indices belong to the index set, and the TCB being an image of the TOB under the inner transform matrix. The outer encoder optionally comprises a feed-forward computation circuit, where the feed-forward computation circuit is configured to receive a sequence of TIB elements and, for each TIB element received, produce a feed-forward value. In embodiments in which the outer transform matrix is an IUT Toeplitz matrix, the feed-forward computation circuit optionally comprises a convolution circuit, with the convolution circuit comprising a plurality of registers, multipliers, and adders and being configured in accordance with an impulse response derived from a first row of the IUT Toeplitz matrix. In some embodiments, the outer encoder is optionally further configured to use the feed-forward value together with a current element of the FDB or a current element of the OCB to generate a next element of the TIB and a next element of the TOB.

A method for use in a communication system for reliable transfer of a source data block (SDB) employs a systematic encoder apparatus configured for an outer transform matrix and an inner transform matrix. Within the method, an inner encoder is configured to receive the SDB and generate an output constraint block (OCB) as an image of the SDB under an inverse of a submatrix of the inner transform matrix, and an outer encoder is configured to receive a fixed data block (FDB) and the OCB and generate a transform output block (TOB) as an image of a transform input block (TIB) under the outer transform matrix, the TIB containing the FDB transparently in a sub-block of the TIB, the TOB containing the OCB transparently in a sub-block of the TOB. The inner encoder is further configured to receive the TOB and generate a transmitted code block (TCB), the TCB containing the SDB transparently in a sub-block of the TCB. The outer transform matrix is optionally an invertible upper-triangular (IUT) matrix, the sub-block of the TOB optionally comprises elements of the TOB whose indices belong to an index set, and the sub-block of the TIB optionally comprises elements of the TIB whose indices belong to a complement of the index set. In embodiments in which the inner transform matrix is an invertible lower-triangular (ILT) matrix, the submatrix of the inner transform matrix optionally comprises elements of the inner transform matrix whose column indices belong to the index set and whose row indices belong to the index set, the sub-block of the TCB optionally comprising elements of the TCB whose indices belong to the index set, and the TCB being an image of the TOB under the inner transform matrix. The outer encoder optionally comprises a feed-forward computation circuit, with the feed-forward computation circuit configured to receive a sequence of TIB elements and, for each TIB element received, produce a feed-forward value. In embodiments in which the outer transform matrix is an IUT Toeplitz matrix, the feed-forward computation circuit optionally comprises a convolution circuit comprising a plurality of registers, multipliers, and adders, the convolution circuit configured in accordance with an impulse response, the impulse response being obtained from a first row of the IUT Toeplitz matrix. The outer encoder may be further configured to use the feed-forward value together with a current element of the FDB or a current element of the OCB to generate a next element of the TIB and a next element of the TOB.

BRIEF DESCRIPTION OF THE DRAWINGS

FIG. 4B is a diagram illustrating an exemplary calculation 450 according to the IUT encoding method 400;

FIG. 5B is a diagram illustrating an exemplary calculation 550 according to the IUT Toeplitz encoding method 500;

FIG. 9B is a diagram illustrating an exemplary calculation 950 according to the IUT Toeplitz transpose-form encoding method 900;

DETAILED DESCRIPTION

Figure 1:
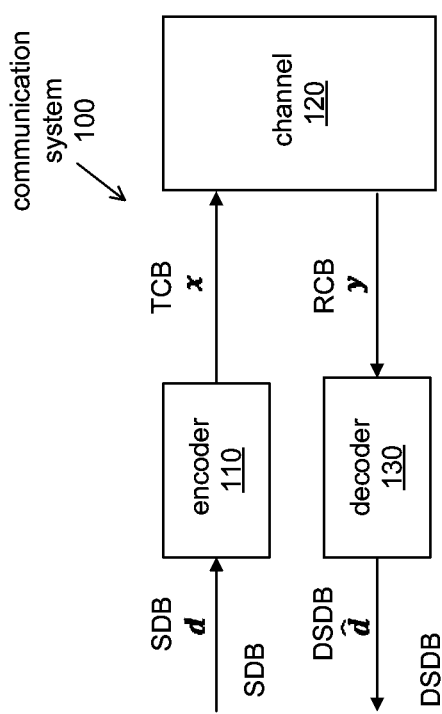
FIG. 1 is a block diagram illustrating a communication system 100 in which embodiments of the present principles may be used.

FIGS. 1 through 12B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged communication system.

We will begin by introducing some notation, terminology, and definitions. We will also state some well-known facts about matrices that will be needed in the subsequent discussion of the present principles.

We use script letters, such as $\mathcal{A}$, to denote sets. The notation $|\mathcal{A}|$ denotes the number of elements in (the cardinality of) $\mathcal{A}$.

The symbol $\mathbb{F}_q$ denotes the finite field with elements $\{0, 1, \ldots, q-1\}$.

The notation $a \in \mathbb{F}_q^n$ indicates that a is a row vector $a=(a_1, a_2, \ldots, a_n)$ with $a_i \in \mathbb{F}_q$ for $i=1, 2, \ldots, n$. For $a \in \mathbb{F}_q^n$ and $\mathcal{S} \subset \{1, 2, \ldots, n\}$, $\boldsymbol{a}_{\mathcal{S}}$ denotes the sub-vector $\boldsymbol{a}_{\mathcal{S}} = (a_i : i \in \mathcal{S})$ that consists of the elements of a with indices in $\mathcal{S}$; likewise, $\boldsymbol{a}_{\mathcal{S}^c} = (a_i : i \in \mathcal{S}^c)$ denotes the sub-vector that consists of the elements of a with indices in the set $\mathcal{S}^c$, where $\mathcal{S}^c$ denotes the complement of $\mathcal{S}$ in $\{1, 2, \ldots, n\}$. For example, if m=8 and $\mathcal{S} = \{1, 2, 3, 5, 8\}$, then, $\boldsymbol{a}_{\mathcal{S}} = (a_1, a_2, a_3, a_5, a_8)$ and $\boldsymbol{a}_{\mathcal{S}^c} = (a_4, a_6, a_7)$. By convention, we write $\boldsymbol{a}_{\mathcal{S}}$ that the coordinates of a appear in $\boldsymbol{a}_{\mathcal{S}}$ in the increasing order; thus, whether one specifies a set $\mathcal{S}$ as $\mathcal{S} = \{1, 2, 3, 5, 8\}$ or $\mathcal{S} = \{2, 3, 1, 5, 8\}$, the sub-vector $\boldsymbol{a}_{\mathcal{S}}$ is given by $\boldsymbol{a}_{\mathcal{S}} = (a_1, a_2, a_3, a_5, a_8)$.

$\mathbb{F}_q^{m \times n}$ denotes the set of all m-by-n matrices with elements from $\mathbb{F}_q$. The notation $A \in \mathbb{F}_q^{m \times n}$ indicates that A is a matrix with m rows and n columns. Often, we define a matrix $A \in \mathbb{F}_q^{m \times n}$ by writing it explicitly as a two-dimensional array $[a_{i,j} : 1 \leq i \leq m, 1 \leq j \leq n]$, where $a_{i,j}$ denotes the element (entry) in the ith row and jth column of A. For an element $a_{i,j}$ of a matrix A, we refer to the index i as a row index and the index j as a column index. The element $a_{i,j}$ is said to be in the ith row and jth column of the matrix A.

The notation 0 will denote a matrix all of whose elements are 0. (The dimensions of 0 will be clear from the context.)

A matrix A is called diagonal if $a_{i,j}=0$ for all $i \neq j$. The diagonal matrix with 1s on the diagonal is called the identity matrix and denoted I.

A matrix $A \in \mathbb{F}_q^{n \times n}$ is called invertible if there exists a matrix $B \in \mathbb{F}_q^{n \times n}$ (called the inverse of A) such that $AB = BA = I$. If it exists, the inverse of A is denoted $A^{-1}$.

If a square matrix $A \in \mathbb{F}_q^{n \times n}$ has a form $$\begin{bmatrix} A_{\mathcal{A},\mathcal{B}} & A_{\mathcal{A},\mathcal{B}^c} \\ A_{\mathcal{A}^c,\mathcal{B}} & A_{\mathcal{A}^c,\mathcal{B}^c} \end{bmatrix}$$

where $\boldsymbol{A}_{\mathcal{A},\mathcal{B}}$ is a square matrix and where either $\boldsymbol{A}_{\mathcal{A},\mathcal{B}^c}=0$ or $\boldsymbol{A}_{\mathcal{A}^c,\mathcal{B}}=0$, then $\det(A)=\det(\boldsymbol{A}_{\mathcal{A},\mathcal{B}})\det(\boldsymbol{A}_{\mathcal{A}^c,\mathcal{B}^c})$; and hence, A is invertible if and only if $\boldsymbol{A}_{\mathcal{A},\mathcal{B}}$ and $\boldsymbol{A}_{\mathcal{A}^c,\mathcal{B}^c}$ are both invertible.

A matrix $A \in \mathbb{F}_q^{n \times n}$ is called lower-triangular if $a_{i,j}=0$ for all $1 \leq i < j \leq n$. A matrix $A \in \mathbb{F}_q^{n \times n}$ is called upper-triangular if $a_{i,j}=0$ for all $1 \leq j < i \leq n$.

A matrix $A \in \mathbb{F}_q^{n \times n}$ is called upper-triangular Toeplitz if there exists a vector $a=(a_0, a_1, \ldots, a_{n-1}) \in \mathbb{F}_q^{n \times n}$ such that A is an upper-triangular matrix with $a_{i,j}=a_{j-i}$ for $j \geq i$, i.e., if A has the form $$A = \begin{bmatrix} a_0 & a_1 & a_2 & \cdots & a_{n-1} \\ 0 & a_0 & a_1 & \cdots & a_{n-2} \\ 0 & 0 & a_0 & \cdots & a_{n-3} \\ \vdots & \vdots & \vdots & \ddots & \vdots \\ 0 & 0 & 0 & \cdots & a_0 \end{bmatrix}.$$

Such a Toeplitz matrix is invertible if and only if $a_0 \neq 0$. Toeplitz matrices we will consider below will be invertible. If A is upper triangular Toeplitz with first row $a=(a_0, a_1, \ldots, a_{n-1})$ and $m \in \{0, 1, \ldots, n-1\}$ is the largest index such that $a_m \neq 0$, then we refer to the initial segment $(a_0, a_1, \ldots, a_m)$ of a as an impulse response and say that the upper-triangular Toeplitz matrix A is defined by the impulse response $(a_0, a_1, \ldots, a_m)$.

The Kronecker product of two matrices $A \in \mathbb{F}_q^{m \times n}$ and $B \in \mathbb{F}_q^{k \times l}$ is defined as the matrix $$A \otimes B = \begin{bmatrix} a_{1,1}B & a_{1,2}B & a_{1,3}B & \cdots & a_{1,n}B \\ a_{2,1}B & a_{2,2}B & a_{2,3}B & \cdots & a_{2,n}B \\ a_{3,1}B & a_{3,2}B & a_{3,3}B & \cdots & a_{3,n}B \\ \vdots & \vdots & \vdots & \ddots & \vdots \\ a_{m,1}B & a_{m,2}B & a_{m,3}B & \cdots & a_{m,n}B \end{bmatrix} \in \mathbb{F}_q^{mk \times nl}$$

The nth Kronecker power $A^{\otimes n}$ of a matrix A is defined inductively as $A^{\otimes 1} = A$ and $A^{\otimes n} = A \otimes A^{\otimes (n-1)}$ for $n \geq 2$.

In the following, the term "transform" is used in the sense of a linear mapping from one vector space to another vector space. Matrices are used to represent transforms in specific forms with respect to specific basis vectors. The term "transform matrix A" will refer to a particular realization of a transform in the form of a specific matrix A. When two vectors a and b are related by a transform relationship $b = aA$ we say that b is the image of a under the transform matrix A.

In the following description, we use row vectors to represent signals (such as source data blocks and coded data blocks); and, a multiplication involving a vector a and a matrix A will always have the form aA (a left multiplication). It is clear that the present principles can be implemented readily using column vectors instead of row vectors and right-multiplications instead of left-multiplications. All such variations of the methods presented below that are based on different representations of vectors spaces or the matrix representations of the transforms acting on such vector spaces fall within the scope of the present principles.

A matrix $P \in \mathbb{F}_q^{N \times N}$ is called a permutation matrix if all entries of P are either 0 or 1 and P has exactly one 1 in each row and one 1 in each column. We will say that two matrices $A \in \mathbb{F}_q^{n \times n}$ and $B \in \mathbb{F}_q^{n \times n}$ are permutation-equivalent if there exist permutation matrices $P \in \mathbb{F}_q^{n \times n}$ and $Q \in \mathbb{F}_q^{n \times n}$ such that $A = PBQ$. Permutation-equivalent matrices differ from each other only by a permutation of the rows and columns, which in a communication system corresponds to receiving source data or transmitting coded data in a different (permuted) order. In the following, the present principles will be described using matrix representations that are most convenient for purposes of explaining the essential ideas; however, the person skilled in the art will have no difficulty in applying the present principles to situations where it may be more desirable to use alternative matrix representations.

The primary motivation for the present principles is to provide systematic encoding methods that can be useful in connection with TF codes and, more specifically, PAC codes, a subclass of TF codes. TF codes are a class of linear block codes whose generator matrix is factored into triangular matrices (or matrices that are permutation-equivalent to triangular matrices) for purposes of encoding and decoding. Before discussing the details of the present principles, we wish to restate the motivation for systematic encoding in more general terms, which will help better understand the benefits and utility of the present principles.

A channel encoder is called systematic if it encodes source data into a codeword in such a way that the source data appears transparently as part of codeword. For a given linear block code, it is possible to encode the source data either in systematic form or non-systematic form. Systematic encoding provides several advantages over non-systematic encoding. First, systematic encoding provides a better bit/symbol error rate (BER/SER) performance than non-systematic encoding. Often, this alone is a sufficient reason for preferring systematic encoding. Second, in many application scenarios, having the source data appear transparently as part of the codeword is a system requirement, rather than on option. Third, systematic encoding makes it possible to complete the decoding immediately when "hard-decisions" on the received codeword yields a valid codeword. Fourth, systematic encoding may be a necessity in various concatenated coding schemes where two or more decoders exchange information over systematically encoded data bits (as in turbo coding).

Despite the advantages of systematic encoding, there is no systematic encoding method in the prior art specifically targeting TF codes. The present disclosure fills this gap in the prior art by providing systematic encoding methods for TF codes that take advantage of the special structure of TF codes. Details of the present principles and their specific embodiments are described below with reference to FIGS. 1 through 12B.

FIG. 1 is a block diagram illustrating a communication system 100, in which embodiments of the present principles may be used. The communication system 100 comprises an encoder 110 located at a transmitter side, a channel 120 connecting the transmitter to a receiver, and a decoder 130 at the receiver side.

The communication system 100 receives a source data block (SDB) d from a source and delivers it as a decoded source data block (DSDB) $\hat{d}$ to a destination. (The source and the destination are not shown in the figure since they are regarded as given and fall outside the scope of the present principles.) A frame error is said to occur when the DSDB $\hat{d}$ does not match the SDB d exactly, i.e., when $\hat{d} \neq d$. A primary performance criterion for the communication system 100 is the frame error rate (FER), defined as the probability Pr ($\hat{d} \neq d$). It is in general preferable to have a communication system 100 with as small a FER as feasible. The encoder 110 and the decoder 130 implement a channel coding scheme in order to reduce the FER at the expense of increased channel bandwidth, equipment cost, and latency. Details of channel coding operation are as follows.

The encoder 110 receives the SDB d and encodes it into a transmitted code block (TCB) x. The channel 120 comprises a channel input and a channel output. The encoder 110 applies the TCB x to the channel input. The channel responds to the TCB x applied to the channel input by producing a received code block (RCB) y at the channel output. The decoder 130 receives the RCB y from the channel output and processes the RCB y to produce the DSDB d̂.

It will be apparent to those skilled in the art that a typical communication system comprises many functional blocks (such as modulators and demodulators, digital-to-analog and analog-to-digital converters, amplifiers, transmit and receive antennas, signal acquisition and synchronization circuitry) that are essential for transmitting and receiving signals across the channel 120. From the viewpoint of the present principles, such functional blocks are regarded as part of the channel 120 and fall outside the scope of the present principles.

The present disclosure is mainly about specific implementations of the encoder 110. Some notational conventions and terminology about the encoding operation are as follows. Throughout the following, we will represent the SDB and the TCB as row vectors $d=(d_1, d_2, \ldots, d_K)$ and $x=(x_1, x_2, \ldots, x_N)$, respectively, where K is a source block length and N is a code block length. The mapping from the SDB d to the TCB x is referred to as a code. Throughout, we will consider codes such that both d and x are vectors over a common finite field $\mathbb{F}_q$. The ratio $R=K/N$ is called the code rate and we will assume that the code rate R is a number satisfying $0 \leq R \leq 1$.

The encoder 110 is called systematic if the SDB d appears transparently as part of the TCB x. The present principles are concerned with systematic encoding of TF codes. TF codes are a type of linear block code that is based on a triangular factorization of an invertible transform matrix $G \in \mathbb{F}_q^{N \times N}$ (a generator matrix) into a product of an invertible upper-triangular (IUT) matrix $U \in \mathbb{F}_q^{N \times N}$ and an invertible lower-triangular (LT) matrix $L \in \mathbb{F}_q^{N \times N}$. We refer to U as the outer transform matrix and L as the inner transform matrix. A preferred embodiment of TF codes is PAC codes for which the outer transform matrix is an IUT Toeplitz matrix and the inner transform matrix is a polar transform matrix (a Kronecker power of a kernel matrix). The prior art on encoding of TF codes is based on non-systematic encoding.

Figure 2:
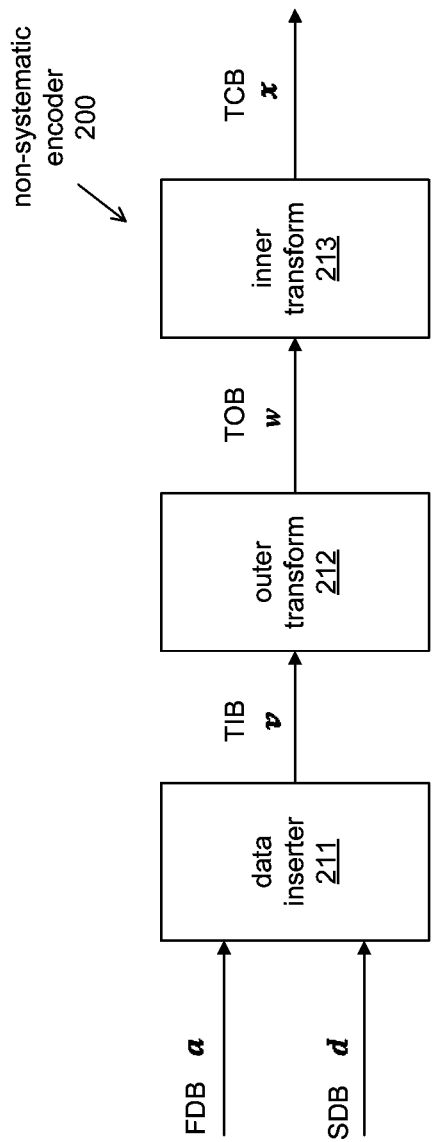
FIG. 2 is a block diagram illustrating a non-systematic encoder 200.

FIG. 2 is a block diagram illustrating a non-systematic encoder 200 for a TF code, where the TF code is as described in [ARI2019b]. As in the case of the encoder 110 of FIG. 1, the overall function of the non-systematic encoder 200 is to receive the SDB $d \in \mathbb{F}_q^K$ from a source and encode it into the TCB $x \in \mathbb{F}_q^N$, where the TCB x is a codeword from the TF code.

The non-systematic encoder 200 comprises a data inserter 211, an outer transform 212, and an inner transform 213. The encoding operation for the non-systematic encoder 200 is configured according to four parameters $(U, L, \mathcal{A}, a)$, where $U \in \mathbb{F}_q^{N \times N}$ is an outer transform matrix, $L \in \mathbb{F}_q^{N \times N}$ is an inner transform matrix, $\mathcal{A} \subset \{1, 2, \ldots, N\}$ is an index set (of size K), and $a \in \mathbb{F}_q^{N-K}$ is a fixed data block (FDB). It is assumed that the matrix representations of the outer and inner transforms are such that U is an IUT matrix and L is an ILT matrix.

The data inserter 211 receives the SDB $d \in \mathbb{F}_q^K$ and generates a transform input block (TIB) $v \in \mathbb{F}_q^K$ so that $\boldsymbol{v}_\mathcal{A} = d$ and $\boldsymbol{v}_{\mathcal{A}^c} = a$, where $\mathcal{A}^c$ denotes the complement of the index set $\mathcal{A}$ (the complement being with respect to the universal set $\{1, 2, \ldots, N\}$). The outer transform 212 receives the TIB v and generates a transform output block TOB $w \in \mathbb{F}_q^N$ so that $w = vU$. The inner transform 213 receives the TOB w and generates the TCB $x \in \mathbb{F}_q^N$ so that $x = wL$. In other words, the TOB is the image of the TIB under the outer transform matrix and the TCB is the image of the TOB under the inner transform matrix.

The present principles provide solutions to the systematic encoding problem for TF codes. Before we begin describing specific methods, it will be useful to discuss the mathematical essence of the systematic encoding problem for TF codes to understand if and under what conditions a solution exists.

In general, the systematic encoding of a TF code can be specified by five parameters $(U, L, \mathcal{A}, \mathcal{B}, a)$, where $U \in \mathbb{F}_q^{N \times N}$ is an outer transform matrix, $L \in \mathbb{F}_q^{N \times N}$ is an inner transform matrix, $\mathcal{A} \subset \{1, 2, \ldots, N\}$ is a first index set (of size K), $\mathcal{B} \subset \{1, 2, \ldots, N\}$ is a second index set (of size N−K), and $a \in \mathbb{F}_q^{N-K}$ is a FDB. We assume that the matrix representations of the outer and inner transforms are such that U is an IUT matrix and L is an ILT matrix.

A systematic encoder with parameters $(U, L, \mathcal{A}, \mathcal{B}, a)$ receives the SDB $d \in \mathbb{F}_q^K$ and generates a pair of vectors $v \in \mathbb{F}_q^N$ and $x \in \mathbb{F}_q^N$ so that $x = vUL$, $\boldsymbol{x}_\mathcal{A} = d$, and $\boldsymbol{v}_\mathcal{B} = a$ are satisfied. To analyze if such a pair of vectors v and x exists, let $G = UL$ denote the generator matrix for the TF code and rewrite the equation $x = UL$ as $\boldsymbol{x}_\mathcal{A} = \boldsymbol{v}_\mathcal{B} \boldsymbol{G}_{\mathcal{B},\mathcal{A}} + \boldsymbol{v}_{\mathcal{B}^c} \boldsymbol{G}_{\mathcal{B}^c,\mathcal{A}}$ and $\boldsymbol{x}_{\mathcal{A}^c} = \boldsymbol{v}_\mathcal{B} \boldsymbol{G}_{\mathcal{B},\mathcal{A}^c} + \boldsymbol{v}_{\mathcal{B}^c} \boldsymbol{G}_{\mathcal{B}^c,\mathcal{A}^c}$. Substituting $\boldsymbol{x}_\mathcal{A} = d$ and $\boldsymbol{v}_\mathcal{B} = a$ in accordance with systematic coding constraints, and solving for $\boldsymbol{x}_{\mathcal{A}^c}$, we obtain a formal solution as $\boldsymbol{x}_{\mathcal{A}^c} = dE + e$ where we have defined $E = (\boldsymbol{G}_{\mathcal{B}^c,\mathcal{A}})^{-1} \boldsymbol{G}_{\mathcal{B}^c,\mathcal{A}^c}$ and $e = a[\boldsymbol{G}_{\mathcal{B},\mathcal{A}^c} - \boldsymbol{G}_{\mathcal{B},\mathcal{A}} (\boldsymbol{G}_{\mathcal{B}^c,\mathcal{A}})^{-1} \boldsymbol{G}_{\mathcal{B}^c,\mathcal{A}^c}]$. This solution is valid if and only if the submatrix $\boldsymbol{G}_{\mathcal{B}^c,\mathcal{A}}$ of the generator matrix G is invertible. A sufficient condition for $\boldsymbol{G}_{\mathcal{B}^c,\mathcal{A}}$ being invertible is given as follows.

Proposition 1. If $\boldsymbol{L}_{\mathcal{A}^c,\mathcal{A}} = 0$, then $\boldsymbol{G}_{\mathcal{B}^c,\mathcal{A}}$ can be made invertible by choosing $\mathcal{B}$ as the complement of $\mathcal{A}$ in $\{1, 2, \ldots, N\}$.

Proof. Suppose $\boldsymbol{L}_{\mathcal{A}^c,\mathcal{A}} = 0$ and set $\mathcal{B} = \mathcal{A}$. Then, $\boldsymbol{G}_{\mathcal{B}^c,\mathcal{A}}$ equals $\boldsymbol{G}_{\mathcal{A},\mathcal{A}}$ which in turn equals $\boldsymbol{U}_{\mathcal{A},\mathcal{A}} \boldsymbol{L}_{\mathcal{A},\mathcal{A}} + \boldsymbol{U}_{\mathcal{A},\mathcal{A}^c} \boldsymbol{L}_{\mathcal{A}^c,\mathcal{A}}$. Using the assumption $\boldsymbol{L}_{\mathcal{A}^c,\mathcal{A}} = 0$, we obtain $\boldsymbol{G}_{\mathcal{A},\mathcal{A}} = \boldsymbol{U}_{\mathcal{A},\mathcal{A}} \boldsymbol{L}_{\mathcal{A},\mathcal{A}}$. Since $\boldsymbol{U}_{\mathcal{A},\mathcal{A}}$ and $\boldsymbol{L}_{\mathcal{A},\mathcal{A}}$ are principal submatrices of triangular matrices, they are invertible. Since the product of two invertible matrices is invertible, $\boldsymbol{G}_{\mathcal{A},\mathcal{A}}$ is invertible.

If $\mathcal{A}$ and $\mathcal{B}$ are selected as in Proposition 1, the systematic encoding equations become $\boldsymbol{x}_\mathcal{A} = d$ and $\boldsymbol{x}_{\mathcal{A}^c} = dE + e$ where $E = (\boldsymbol{G}_{\mathcal{A},\mathcal{A}})^{-1} \boldsymbol{G}_{\mathcal{A},\mathcal{A}^c}$ and $e = a [\boldsymbol{G}_{\mathcal{A}^c,\mathcal{A}^c} - \boldsymbol{G}_{\mathcal{A}^c,\mathcal{A}} (\boldsymbol{G}_{\mathcal{A},\mathcal{A}})^{-1} \boldsymbol{G}_{\mathcal{A},\mathcal{A}^c}]$. In implementing such a systematic encoder, one can pre-compute the matrix $E \in \mathbb{F}_q^{(N-K) \times (N-K)}$ and the vector $e \in \mathbb{F}_q^{N-K}$ and configure the systematic encoder accordingly.

We have shown that under the conditions of Proposition 1, the systematic encoding problem is feasible. However, a direct solution of the systematic encoding problem by computing $\boldsymbol{x}_{\mathcal{A}^c} = dE + e$ is far from being practical. Computing the product dE directly involves $O((N-K)^2)$ arithmetic operations (additions and multiplications in the field $\mathbb{F}_q$), which is typically prohibitively complex for many practical applications.

It is an object of the present principles to reduce the complexity of systematic encoding of TF codes. To this end, the present principles exploit the triangular factorization of the generator matrix G into U and L in solving the systematic encoding problem. We begin by describing a general framework for the application of the present principles. In describing the general framework, it will be sufficient to use four parameters $(U, L, \mathcal{A}, a)$ instead of $(U, L, \mathcal{A}, \mathcal{B}, a)$ by restricting attention to the cases where $\mathcal{B}$ is the complement of $\mathcal{A}$ in $\{1, 2, \ldots, N\}$.

Figure 3:
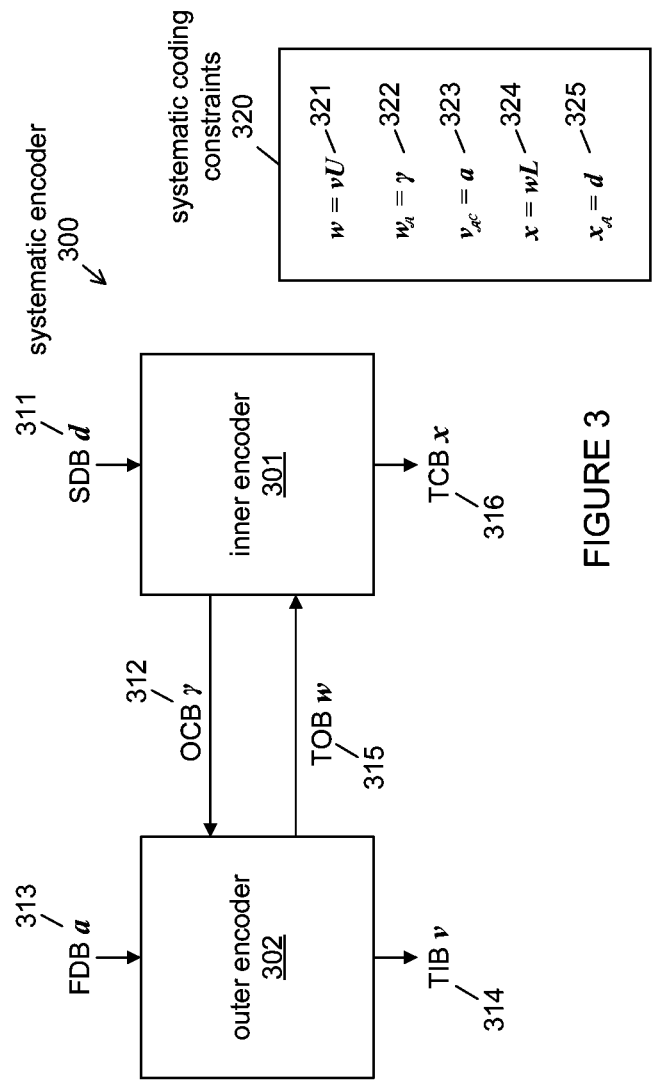
FIG. 3 is a diagram displaying a systematic encoder 300 according to the present principles.

FIG. 3 is a block diagram illustrating a systematic encoder 300 for a TF code in accordance with the present principles. As in the case of the non-systematic encoder 200, the TF code for the systematic encoder 300 is characterized by a set of four parameters (U, L, $\mathcal{A}$, a), where $U \in \mathbb{F}_q^{N \times N}$ is an outer transform matrix, $L \in \mathbb{F}_q^{N \times N}$ is an inner transform matrix, $\mathcal{A} \subset \{1, 2, \ldots, N\}$ is an index set of size K, and $a \in \mathbb{F}_q^{N-K}$ is a fixed data block (FDB). It is assumed that the matrix representations of the outer and inner transforms are such that U is an IUT matrix and L is an ILT matrix. Further, it is assumed that the parameters are chosen so that $L_{\mathcal{A}^c, \mathcal{A}} = 0$.

The systematic encoder 300 comprises an inner encoder 301 and an outer encoder 302 and operates according to systematic coding constraints 320. The operation of the systematic encoder 300 will be described by dividing the operation into three steps.

In the first step, the inner encoder 301 receives the SDB $d \in \mathbb{F}_q^K$ 311 and generates an outer constraint block (OCB) $\gamma \in \mathbb{F}_q^K$ 312 such that $\gamma = d(L_{\mathcal{A}, \mathcal{A}})^{-1}$. In other words, the OCB 312 $\gamma$ is generated as the image of the SDB d 311 under the inverse of the submatrix $L_{\mathcal{A}, \mathcal{A}}$ of the inner transform matrix. As already pointed out above, $L_{\mathcal{A}, \mathcal{A}}$ is invertible due to the assumption that $L_{\mathcal{A}^c, \mathcal{A}} = 0$.

In the second step, the outer encoder 302 receives the FDB a 313 and the OCB $\gamma$ 312 and generates a TIB v 314 and a TOB w 315 such that an outer transform constraint w=vU 321, an OCB constraint $w_{\mathcal{A}} = \gamma$ 322, and an FDB constraint $v_{\mathcal{A}^c} = a$ 323 are satisfied. In the third step, the inner encoder 301 receives the TOB w 315 and generates the TCB x 316 so that an inner transform constraint x=wL 324 is satisfied. We now provide a proof that at the end of the third step we obtain systematic encoding in the sense that the TCB x 316 satisfies a systematic coding constraint $x_{\mathcal{A}} = d$ 325.

We observe that the inner transform operation x=wL in the third step contains a subset of equations $x_{\mathcal{A}} = w_{\mathcal{A}} L_{\mathcal{A}, \mathcal{A}} + w_{\mathcal{A}^c} L_{\mathcal{A}^c, \mathcal{A}}$. Since $L_{\mathcal{A}^c, \mathcal{A}} = 0$ (by assumption) and $w_{\mathcal{A}} = \gamma$ (by the second step), the operation in third step is equivalent to $x_{\mathcal{A}} = \gamma L_{\mathcal{A}, \mathcal{A}}$. Substituting $\gamma = d(L_{\mathcal{A}, \mathcal{A}})^{-1}$ from the first step, we see that the third step yields $x_{\mathcal{A}} = d$. This argument shows that the systematic encoder 300 is indeed systematic.

The preceding argument also reveals the crucial role of the condition $L_{\mathcal{A}^c, \mathcal{A}} = 0$ in relation to the present principles. The introduction of $L_{\mathcal{A}^c, \mathcal{A}} = 0$ as a condition on the choice of code parameters and the resulting decomposition of the systematic encoding of TF codes into three smaller sub-problems is an important novel aspect of the present principles. We now discuss how each step can be implemented and assess their complexity.

The first step of the systematic encoder 300 involves computing the OCB $\gamma = d(L_{\mathcal{A}, \mathcal{A}})^{-1}$. Since $L_{\mathcal{A}, \mathcal{A}}$ is an ILT matrix (a property it inherits from L) and since the inverse of an ILT matrix is ILT, the matrix $(L_{\mathcal{A}, \mathcal{A}})^{-1}$ is ILT. If L has no structure other than being ILT, then a direct computation of $\gamma = d(L_{\mathcal{A}, \mathcal{A}})^{-1}$ may be the only option. In that case, the matrix $(L_{\mathcal{A}, \mathcal{A}})^{-1}$ can be pre-computed and the inner encoder 301 can be pre-configured with knowledge of $(L_{\mathcal{A}, \mathcal{A}})^{-1}$. The storage complexity of $(L_{\mathcal{A}, \mathcal{A}})^{-1}$ is $O(K^2)$ and the arithmetic complexity of computing $\gamma = d(L_{\mathcal{A}, \mathcal{A}})^{-1}$ is also $O(K^2)$. As already pointed out, a complexity $O(K^2)$ is often prohibitive for many applications. Fortunately, when we consider special cases of TF coding, such as PAC coding, the complexity of the present principles is reduced to practical levels.

An important special case of TF codes is PAC codes, in which case the inner transform matrix L has the form of a Kronecker power, e.g., $L = F^{\otimes n}$ with $$F = \begin{bmatrix} 1 & 0 \\ 1 & 1 \end{bmatrix}$$

and $n = \log_2 N$. The inverse of such an inner transform L is itself, $L^{-1} = L$, which together with the condition $L_{\mathcal{A}^c, \mathcal{A}} = 0$ implies that $(L_{\mathcal{A}, \mathcal{A}})^{-1} = L_{\mathcal{A}, \mathcal{A}}$. In this case, a preferred method of computing $\gamma = d(L_{\mathcal{A}, \mathcal{A}})^{-1}$ is to prepare a vector x' by setting $(x')_{\mathcal{A}} = d$ and $(x')_{\mathcal{A}^c} = 0$, then compute w'=x'L, and finally extract $\gamma$ from w' by setting $\gamma = (w')_{\mathcal{A}}$. The transform step w'=x'L can be implemented by exploiting the recursive structure of L, resulting in a complexity of O(N log N), which may be significantly better than the complexity $O(K^2)$ of computing $\gamma = d(L_{\mathcal{A}, \mathcal{A}})^{-1}$ directly. (The problem with direct computation is that the recursive structure of L may get lost when we consider the submatrix $L_{\mathcal{A}, \mathcal{A}}$.)

The person skilled in the art will recognize that the above method of computing the OCB $\gamma$ by exploiting the recursive structure of the polar transform exploits the prior art on systematic encoding of polar codes. It is worth pointing out that when $L = F^{\otimes n}$, the condition $L_{\mathcal{A}^c, \mathcal{A}} = 0$ that we imposed on the systematic encoder 300 is usually satisfied by the preferred choice of the set $\mathcal{A}$ for PAC codes. In other words, the condition $L_{\mathcal{A}^c, \mathcal{A}} = 0$ does not necessarily imply a loss of optimality in the construction of PAC codes.

The comments on the complexity of the first step of the systematic encoder 300 are valid to a great extent for the complexity of the third step. For a general LT matrix L, the complexity of computing x=wL is $O(N^2)$. On the other hand, for a PAC code with $L = F^{\otimes n}$, the complexity of the third step is reduced to O(N log N), which is the complexity of encoding a polar code. Thus, the first and third steps of the systematic encoder 250, which are carried out by the inner encoder 301, have a combined complexity O(N log N) in the case of PAC codes, which are the codes of main interest for the present principles.

We now turn attention to the complexity of the outer encoder 302, which carries out the second step of the systematic encoder 300.

Proposition 2. For any instance of parameters (U, $\mathcal{A}$, a, $\gamma$), there exist realizations of the outer encoder 302 that solve the outer encoding problem (find the unique TIB v 314 and TOB w 315 pair that satisfy the constraints 321, 322, and 323) using $O(N^2)$ arithmetic operations (additions and multiplications in $\mathbb{F}_q$). If U is Toeplitz (in addition to being IUT) with an impulse response $g = (g_0, g_1, \ldots, g_m) \in \mathbb{F}_q^{m+1}$, then there exist realizations of the outer encoder 302 that solve the outer encoding problem using O(mN) arithmetic operations.

Proof. We will prove the claim by giving an algorithm that computes the solution. Let $u_{i,j}$ denote the (i,j)th element of U. Since U is upper-triangular by assumption, $u_{i,j} = 0$ for i>j. Thus, the system of equations w=vU can be written as $w_1 = v_1 u_{1,1}$, $w_2 = v_1 u_{1,2} + v_2 u_{2,2}$, and more generally, $w_i = v_1 u_{1,i} + \ldots + v_{i-1} u_{i-1,i} + v_i u_{i,i}$ for i=1,2, ..., N. These equations can be solved sequentially. The first equation is $w_1 = v_1 u_{1,1}$ and we have two cases, either $1 \in \mathcal{A}^c$ or $1 \in \mathcal{A}$. In the first case, $(v_1, w_1) = (a_1, a_1 u_{1,1})$; in the second case, $(v_1, w_1) = (\gamma_1 (u_{1,1})^{-1}, \gamma_1)$ where $(u_{1,1})^{-1}$ is the multiplicative inverse of $u_{1,1}$. Note that, since U is invertible by assumption, $u_{i,i} \neq 0$ and the multiplicative inverse $(u_{i,i})^{-1}$ exists for every i. As an induction hypothesis, suppose that $(v_h, w_h)$ has been determined for each h=1, 2, ..., i−1, and consider the next pair $(v_i, w_i)$. Define a feed-forward variable $s=v_1u_{1,i}+ \ldots +v_{i-1}u_{i-1,i}$. Note that the value of the feed-forward variable s becomes available at the end of step i−1 of the above algorithm and is available for computing the pair $(v_i, w_i)$ at step i. One of the two unknowns $(v_i, w_i)$ is also known at step i since either $i \in \mathcal{A}^c$ and $v_i = a_k$ for some element of the FDB a or $i \in \mathcal{A}$ and $w_i = \gamma_j$ for some element $\gamma_j$ of the OCB γ. In either case, the remaining element of the pair can be obtained from the relation $w_i = s + v_i u_{i,i}$. Specifically, if $i \in \mathcal{A}^c$, then $(v_i, w_i) = (a_k, s + a_k u_{i,i})$; alternatively, if $i \in \mathcal{A}$, then $(v_i, w_i) = ((\gamma_j - s)(u_{i,i})^{-1}, \gamma_j)$. This completes the proof that the solution (v, w) exists and is unique.

The complexity of the above procedure is dominated by the computation of the feed-forward variable s. There are N feed-forward variable calculations, each requiring at most N multiplication and N−1 addition operations. So, the overall complexity is $O(N^2)$. If U is IUT Toeplitz with an impulse response $g=(g_0, g_1, \ldots, g_m) \in \mathbb{F}_q^{m+1}$ then $w_i = v_i g_0 + v_{i-1} g_1 + \ldots + v_{i-m} g_m$ for i=1,2, ..., N, with the notational convention that $v_{i-j} = 0$ if j≥i. The feed-forward variable is given by $s = v_{i-1} g_1 + \ldots + v_{i-m} g_m$, which requires at most m multiplications and m−1 additions. Thus, the complexity of computing the feed-forward variable s is reduced from O(N) to O(m), and the overall complexity becomes O(mN). This completes the proof of Proposition 2.

The procedure given in the proof of Proposition 2 forms the basis of the outer encoder 302 in accordance with the present principles. We will now give a more precise algorithmic description of this procedure.

Figure 4A:
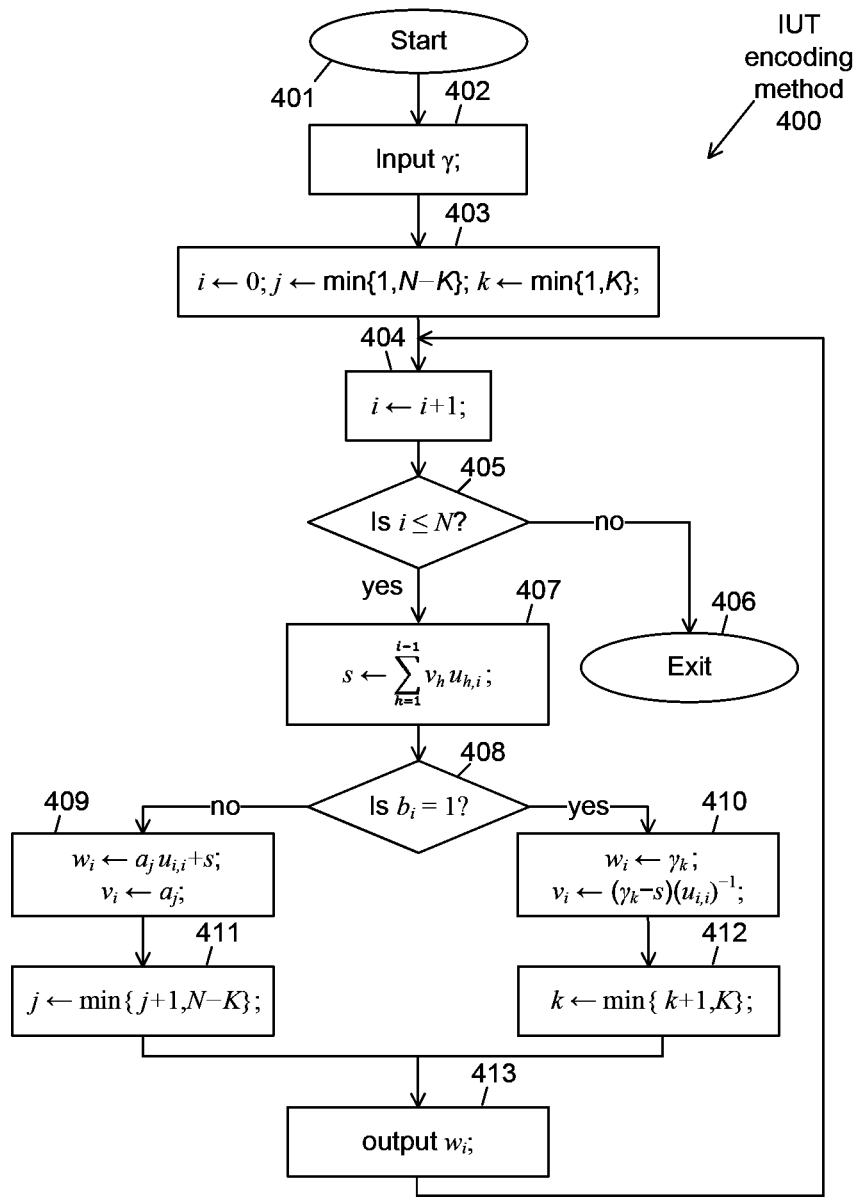
FIG. 4A is a flowchart of an IUT encoding method 400 according to the present principles.

FIG. 4A is a flowchart of an IUT encoding method 400 for implementing the outer encoder 302 in accordance with the present principles. The IUT encoding method 400 (hereafter, the method 400) is configured for operation with the four parameters (U, $\mathcal{A}$, a, γ), which have been defined above in connection with the outer encoder 302. The method 400 solves the outer encoding problem by computing a TIB v 314 and TOB w 315 pair satisfying the constraints 321, 322 and 323. The method 400 begins operations in a start step 401 and moves into an OCB input step 402 when a new OCB $\gamma \in \mathbb{F}_q^K$ 312 becomes available for encoding. In the OCB input step 402, the method 400 fetches the OCB γ 312 from outside, e.g., from the inner encoder 301.

Following the OCB input step 402, the method 400 moves to a variable initialization step 403 and initializes a loop counter i, an FDB constraint counter j, and an OCB constraint counter k. The loop counter i counts the number of times the method 400 executes a main loop, where the main loop begins with the execution of the loop counter increment step 404. The initial value of the loop counter i is set to 0 in the step 403. The FDB constraint counter j is initialized as j←min {1, N−K}, and at any moment during the operation of the method 400, the counter j indicates which constraint among the N−K FDB constraints 323 is going to be processed next by the method 400. If the number of FDB constraints 323 is 0, i.e., if N−K=0, then the FDB constraint counter j is set to 0 in the step 403 and remains 0 throughout the rest of the operation of the method 400. The OCB constraint counter k is initialized as k←min {1, K}, and at any moment during the operation of the method 400, the counter k indicates which constraint among the K OCB constraints 322 is going to be processed next by the method 400. If the number of OCB constraints is 0, i.e., if K=0, then the OCB constraint counter k is set to 0 in the step 403 and remains 0 throughout the rest of the operation of the method 400.

Following the variable initialization step 403, the method 400 executes a loop counter increment step 404 by incrementing the loop counter i by 1. The step 404 marks the beginning of the main loop for the method 400. The main loop is executed N times. During the ith execution of the main loop, the method 400 processes a feed-forward value s together with a current element $a_j$ of the FDB a 313 or a current element $\gamma_k$ of the OCB γ 312 to a generate a next element $v_i$ of the TIB v 314 and a next element $w_i$ of the TOB w 315. The details of the main loop are as follows.

The method 400 enters a loop counter check step 405 following the step 404 and checks if the loop counter i is still less than or equal to its final value N. If a result of the check is NO, the method 400 moves into an exit step 406. (If a next OCB is available for encoding, the exit step 406 may be bypassed and the method 400 may proceed to the processing the next OCB by reentering the OCB input step 402.) If the result of the check in the step 405 is YES, the method 400 moves into a feed-forward computation step 407 and computes a feed-forward value $s = \sum_{h=1}^{i-1} v_h u_{h,i}$. If i=1, the feed-forward value is set to zero, s=0. The next step from the step 407 is a constraint-type check step 408.

In the constraint-type check step 408, a check is made to see if the next constraint to be processed is an FDB constraint 323 (indicated by $b_i = 0$) or an OCB constraint 322 (indicated by $b_i = 1$). Here, $b = (b_1, b_2, \ldots, b_N)$ is a constraint type indicator (CTI) derived from the index set $\mathcal{A}$ so that $b_i = 1$ if $i \in \mathcal{A}$ and $b_i = 0$ if $i \notin \mathcal{A}$. In other words, the CTI b is the indicator vector of the index set $\mathcal{A}$. Checking whether $i \in \mathcal{A}$ by looking at the ith coordinate of the CTI b is more efficient than searching the set $\mathcal{A}$ to see if it contains i. Using a Boolean vector for such purpose is especially useful in the hardware implementations discussed below.

If a result of the constraint-type check step 408 is NO, then the method 400 executes an FDB constraint processing step 409 by setting $w_i = a_j u_{i,i} + s$ and $v_i = a_j$. The step 409 is always followed by a step 411, in which the FDB constraint counter j is updated as j←min {j+1, N−K}. At the end of the step 411, the FDB constraint counter j points at the next FDB constraint 323 to be processed if there is any left; if all FDB constraints 323 have been processed, the value of j remains as N−K.

If the result of the constraint-type check step 408 is YES, then the method 400 executes an OCB constraint processing step 410 by setting $w_i = \gamma_k$ and $v_i = (\gamma_k - s)(u_{i,i})^{-1}$. The step 410 is always followed by a step 412, in which the OCB constraint counter k is updated as k←min {k+1, K}. At the end of the step 412, the OCB constraint 322 counter k points at the next OCB constraint to be processed if there is any left; if all OCB constraints 322 have been processed, the value of k remains as K.

The steps 411 and 412 are both followed by an output step 413, in which the method 400 outputs the ith element $w_i$ of the TOB w 315. Optionally, the method 400 may output the ith element $v_i$ of the TIB v 314 as part of the output step 413.

Following the output step 413, the method 400 loops back to the step 404 and continues operating as described above.

It is possible to simplify the method 400 somewhat by eliminating all "min" operations and using j←1 and k←1 instead of j←min {1, N−K} and k←min {1, K} in the step 403, and j←j+1 and k←1 instead of j←min {j+1, N−K} and k←min {k+1, K} in the steps 411 and 412. This simplification allows j or k to take on out-of-range values, but an inspection of the method 400 reveals that the TIB v 314 and the TOB w 315 will still be computed correctly. This type of simplification is also valid in the more specific embodiments of the method 400 as discussed below in connection with FIGS. 5 and 9.

Another simplification takes place in the implementation of the method 400 when the diagonal elements of the IUT matrix U are all 1 (the multiplicative identity in $\mathbb{F}_q$), then the operation $w_i = a_j u_{i,i} + s$ in the step 409 simplifies to $w_i = a_j + s$ and the operation $v_i = (\gamma_k - s)(u_{i,i})^{-1}$ in the step 410 simplifies to and $v_i = \gamma_k - s$. In particular, when the transform operations are over the binary field $\mathbb{F}_q^{N \times N} {}_2 = \{0,1\}$, all multiplication and division operations in the method 400 can be replaced with simpler operations, which reduces the complexity of implementing the outer encoder 302 both in hardware and software.

FIG. 4B is a diagram illustrating an exemplary calculation 450 according to the method 400. The exemplary calculation 450 uses an exemplary IUT matrix U 452, an exemplary CTI b 453, an exemplary FDB a 454, and an exemplary OCB γ 455. The exemplary calculation 450 is assumed to be over the binary field $F_2$. By inspecting the exemplary parameters 453 and 454, we understand that the length parameters in this exemplary calculation are N=8 and K=3. Details of the exemplary calculation 450 are shown in a table 451. The ith row of the table 451 lists values of the variables of the method 400, where the values are sampled immediately after completion of the FDB constraint processing step 409 or the OCB constraint processing step 410. At the end of the exemplary calculation, an exemplary TIB v 456 and an exemplary TOB w 457 are obtained. It can be verified easily that the exemplary variables 452 through 457 satisfy the transform constraint w=vU 321, the FDB constraint $v_{\mathcal{A}^c} = a$ 323, and the OCB constraint $w_{\mathcal{A}} = \gamma$ 322 with $\mathcal{A} = \{4, 6, 8\}$ and $\mathcal{A}^c = \{1, 2, 3, 5, 7\}$.

Although the method 400 provides a solution to the outer encoding problem, it has complexity $O(N^2)$ for a general LUT matrix $U \in \mathbb{F}_q^{N \times N}$, which is often prohibitive in practice. The complexity can be reduced if U has a special structure. A particularly important case is when U is Toeplitz in addition to being IUT, as in the case of PAC codes. We now turn our focus to this important special case.

Figure 5A:
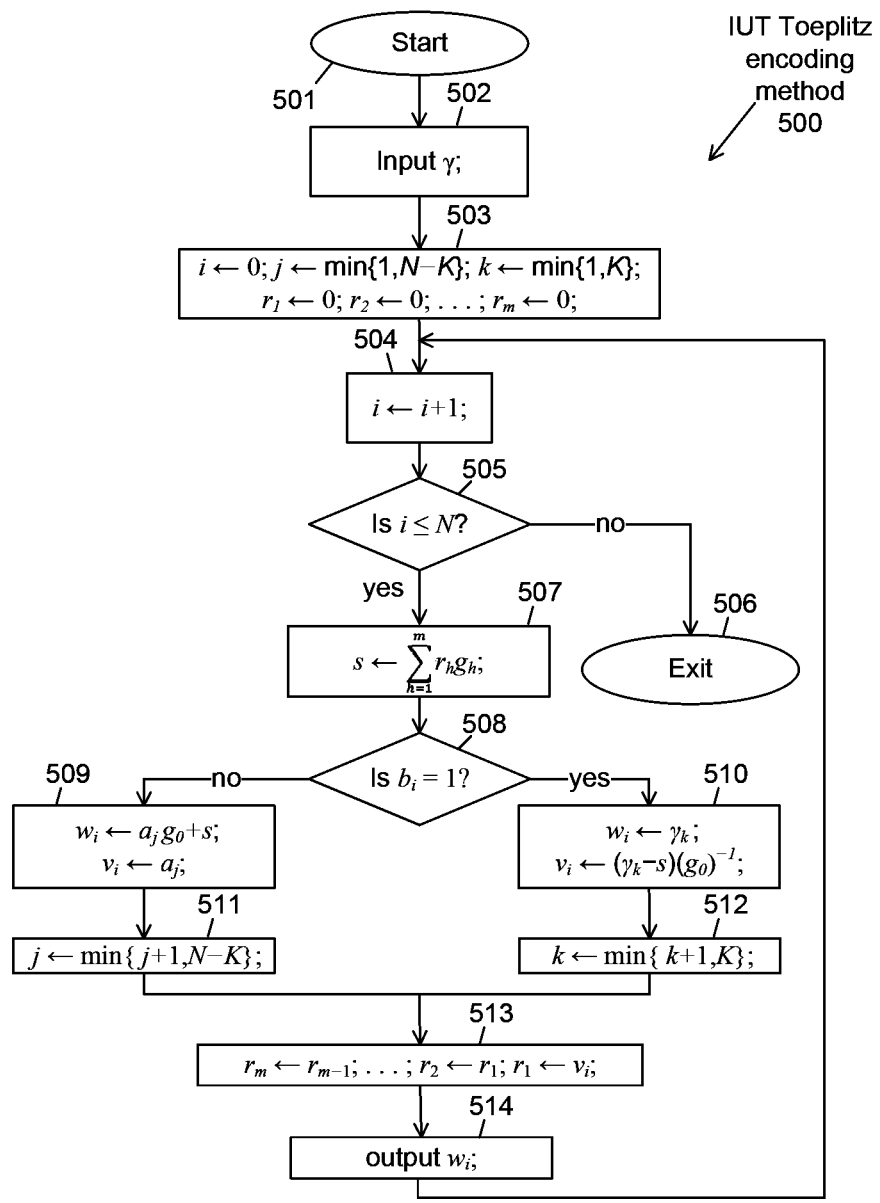
FIG. 5A is a flowchart illustrating an IUT Toeplitz encoding method 500 according to the present principles.

FIG. 5A is a flowchart illustrating an IUT Toeplitz encoding method 500 for implementing the outer encoder 302 in accordance with the present principles. The IUT Toeplitz encoding method 500 (hereafter, the method 500) is a special instance of the method 400 adapted to the case where the outer transform matrix U is an IUT Toeplitz matrix. In accordance with the IUT Toeplitz assumption, the method 500 is configured for an impulse response $g = (g_0, g_1, \ldots, g_m) \in \mathbb{F}_q^{m+1}$, with $g_0 \neq 0$ and $g_m \neq 0$, and where the impulse response g is derived from the first row of the outer transform matrix $U \in \mathbb{F}_q^{N \times N}$.

The method 500 begins operations in a start step 501 and moves into an OCB input step 502 when the OCB $\gamma \in \mathbb{F}_q^K$ 312 becomes available for encoding. In the OCB input step 502, the method 500 fetches the OCB γ 312 from outside, e.g., from the inner encoder 301.

Following the OCB input step 502, the method 500 moves to a variable initialization step 503 and initializes a loop counter i, an FDB constraint counter j, an OCB constraint counter k, and initializes a register array $r = (r_1, \ldots, r_m)$ by setting $r_i \leftarrow 0$ for $i = 1, \ldots, m$. The counters i, j, and k perform the same counting functions as in the case of the method 400. The role of the register array r will become clear in the following discussion.

As in the case of the method 400, the initialization and updates of the counters j and k can be simplified by removing the "min" operation in the same way as described for the method 400. Such a simplification does not affect the final values of the TIB v 314 and TOB w 315 calculated by the method 500.

Following the variable initialization step 503, the method 500 executes a loop counter increment step 504 by incrementing the loop counter i by 1. The step 504 marks the beginning of a main loop for the method 500. The main loop is executed N times each time the method 500 is invoked. During the ith execution of the main loop, the method 500 processes a feed-forward value s together with a current element $a_j$ of the FDB a 313 or a current element $\gamma_k$ of the OCB γ 312 to a generate a next element $v_i$ of the TIB v 314 and a next element $w_i$ of the TOB w 315. The details of the main loop are as follows.

The method 500 enters a loop counter check step 505 following the step 504 and checks if the loop counter i is still less than or equal to its final value N. If a result of the check is NO, the method 500 moves into an exit step 506. (If a next OCB 312 is available for encoding, the exit step 506 may be bypassed and the method 500 may proceed to the encoding of the next OCB by reentering the OCB input step 502.) If the result of the check in the step 505 is YES, the method 500 moves into a feed-forward computation step 507, computes a feed-forward value $s = \sum_{h=1}^{m} r_h g_h$, and moves into a constraint-type check step 508.

In the constraint-type check step 508, a check is made to see if the next constraint to be processed is an FDB constraint 323 (indicated by $b_i = 0$) or an OCB constraint 322 (indicated by $b_i = 1$).

If a result of the constraint-type check step 508 is NO, then the method 500 executes an FDB constraint processing step 509 by setting $w_i = a_j g_0 + s$ and $v_i = a_j$. The step 509 is followed by a step 511, in which the FDB constraint counter j is updated as $j \leftarrow \min\{j+1, N-K\}$. At the end of the step 511, the FDB constraint counter j points at the next FDB constraint 323 to be processed if there is any left; if all FDB constraints 323 have been processed, the value of j remains as N−K.

If the result of the constraint-type check step 508 is YES, then the method 500 executes an OCB constraint processing step 510 by setting $w_i = \gamma_k$ and $v_i = (\gamma_k - s)(g_0)^{-1}$. The step 510 is followed by a step 512, in which the OCB constraint counter k is updated as $k \leftarrow \min\{k+1, K\}$. At the end of the step 512, the OCB constraint counter k points at the next OCB constraint 322 to be processed if there is any left; if all OCB constraints 322 have been processed, the value of k remains as K.

The steps 511 and 512 are both followed by a register update step 513, in which the contents of the register array r are shifted one place to the right by setting $r_h \leftarrow r_{h-1}$ in the order $h = m, m-1, \ldots, 2$, followed by $r_1 \leftarrow v_i$.

The step 513 is followed by an output step 514, in which the method 500 outputs the ith element $w_i$ of the TOB w 315. Optionally, the method 500 may output the ith element $v_i$ of the TIB v 314 as part of the output step 514.

Following the output step 514, the method 500 loops back to the step 504 and continues operating as described above.

The complexity of the method 500 is O(mN), which is typically significantly smaller than the complexity $O(N^2)$ for the method 400. For example, in the case of PAC codes, the parameter m is usually a fixed small integer while N may be arbitrarily large.

The main benefit of the present principles becomes visible at this point. Thanks to the decomposition of the systematic encoding problem for TF codes into three steps, an outer encoder has been obtained that can take full advantage of a Toeplitz form of the outer transform matrix and solve the outer encoding problem at complexity O(mN). This complexity compares very favorably with the complexity $O(N^2)$ of a general systematic encoder for TF codes. In particular, the direct method of systematic encoding of TF codes, as discussed above, would compute the TCB x by setting $x_\mathcal{A}$=d and $x_{\mathcal{A}^c}$=dE+e. The direct method does not exploit any Toeplitz structure of the outer transform matrix and suffers from $O(N^2)$ complexity, while the present principles reduce the complexity to O(mN).

It is possible to simplify the method 500 by eliminating all "min" operations as in the case of the method 400. As in the case of the method 400, another simplification takes place in the implementation of the method 500 when the diagonal elements of the IUT transform U are all 1 (the multiplicative identity in $\mathbb{F}_q$) or when the transform operations are over the binary field $\mathbb{F}_2 = \{0, 1\}$.

FIG. 5B is a diagram illustrating in tabular form an exemplary calculation 550 according to the method 500. The exemplary calculation 550 uses an exemplary IUT Toeplitz matrix U 552, an exemplary CTI b 553, an exemplary FDB a 554, and an exemplary OCB γ 555. The exemplary calculation 550 is assumed to be over the binary field $\mathbb{F}_2$. By inspecting the exemplary parameters 553 and 554, we understand that the length parameters in the exemplary calculation 550 are N=8 and K=3. Details of the exemplary calculation 550 are shown in a table 551. The ith row of the table 551 lists values of the variables of the method 500, where the values are sampled immediately after completion of the FDB constraint processing step 509 or the OCB constraint processing step 510. At the end of the exemplary calculation 550, an exemplary TIB v 556 and an exemplary TOB w 557 are obtained. It can be verified easily that the exemplary variables 552 through 557 satisfy the transform constraint w=vU 321, the FDB constraint $v_{\mathcal{A}^c}$=a 323, and the OCB constraint $w_\mathcal{A}$=γ 322 with $\mathcal{A}$={4,6,8} and $\mathcal{A}^c$={1,2, 3, 5, 7}.

We now turn our attention to providing an efficient hardware implementation of the method 500. The most computationally intensive step of the method 500 is the feed-forward computation step 507. This step can be carried out using well-known convolution circuits. To discuss such circuits, it will be convenient to use a polynomial representation of the Toeplitz matrix operations.

Proposition 3. Let $U \in \mathbb{F}_q^{N \times N}$ be an upper-triangular Toeplitz matrix with first row $g=(g_0, g_1, \ldots, g_{N-1}) \in \mathbb{F}_q^N$, let $v=(v_1, v_2, \ldots, v_N) \in \mathbb{F}_q^N$ be an arbitrary vector, and let $w=(w_1, w_2, \ldots, w_N) \in \mathbb{F}_q^N$ be defined by the product w=vU. Define the polynomials $g(D)=g_0+g_1 D + \ldots + g_{N-1} D^{N-1}$, $v(D)=v_1+v_2 D + \ldots + v_N D^{N-1}$, and $w(D)=w_1 + w_2 D + \ldots + w_N D^{N-1}$. Then, the relation w=vU can be expressed in terms of polynomials as $w(D)=v(D)g(D) \mod D^N$.

Proof. Suppose w=vU. Then, by definition of matrix multiplication, we have $w_i = \sum_{h=1}^{N} v_h u_{h,i}$ for $1 \le i \le N$. Since U is upper-triangular and Toeplitz, we have $u_{h,i}=g_{i-h}$ if $1 \le h \le i \le N$; and, $u_{h,i}=0$ otherwise. Thus, $w_i = \sum_{h=1}^{i} v_h g_{i-h}$ for $1 \le i \le N$. We observe that, for $1 \le i \le N$, the term $w_i$ is the coefficient of $D^{i-1}$ in the product v(D)g(D). In other words, w(D) equals $v(D)g(D) \mod D^N$ as claimed.

The person skilled in the art of digital signal processing will recognize that the relationship $w(D)=v(D)g(D) \mod D^N$, or equivalently the equations $w_i = \sum_{h=1}^{i} v_h g_{i-h}$, $1 \le i \le N$, define a convolution relationship between the TIB v 314 and the TOB w 315. Specifically, the TOB w 315 may be regarded as the first N terms produced by a linear time-invariant filter with an impulse response $g=(g_0, g_1, \ldots, g_{N-1})$ when the TIB v 314 is applied as the input. There are many circuits for realization of such filters in hardware, which can be used in the present context to implement the method 500. In order to minimize the hardware complexity, we will henceforth omit the trailing zeros of the impulse response $g=(g_0, g_1, \ldots, g_{N-1})$ and write $g=(g_0, g_1, \ldots, g_m)$ where m is the largest integer i in the range $0 \le i \le N-1$ such that $g_i \ne 0$. In circuit implementations that are given below, the parameter m will be the number of register stages that are required. In typical applications of the present principles, the parameter m will be fixed as some number significantly smaller than the code block length N.

Figure 6:
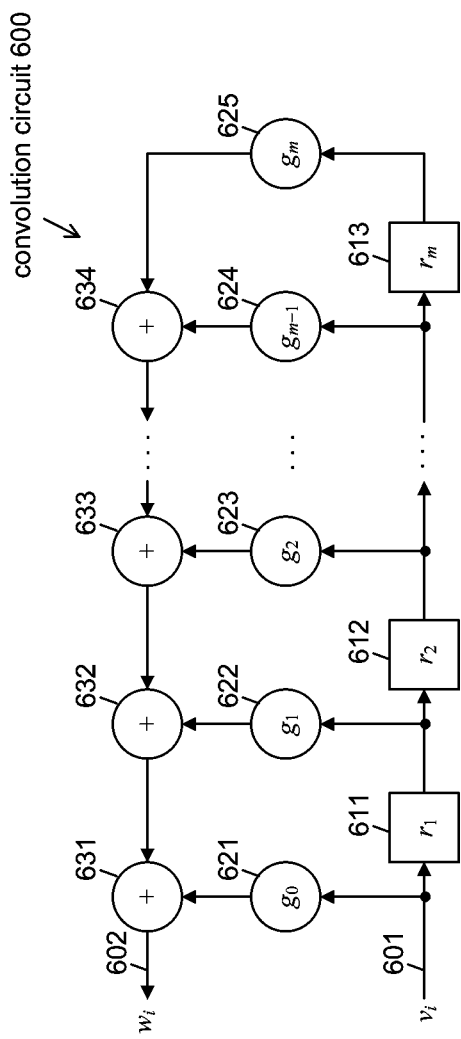
FIG. 6 is a schematic diagram of a convolution circuit 600.

FIG. 6 is a schematic diagram of a convolution circuit 600. The convolution circuit 600 is configured for computing the product $w(D)=v(D)g(D) \mod D^N$ in Proposition 3, wherein $g(D)=g_0+g_1 D + \ldots + g_m D^m$ is fixed polynomial, $v(D)=v_1+v_2 D + \ldots + v_N D^{N-1}$ and $w(D)=w_1 + w_2 D + \ldots + w_N D^{N-1}$ are an input polynomial and an output polynomial, respectively.

The convolution circuit 600 comprises an input port 601, an output port 602, registers 611-613, multipliers 621-625, and adders 631-634. The convolution circuit 600 receives the coefficients $v_i$ of the input polynomial v(D) at the input port 601 in the natural order $v_1$ (first), $v_2, \ldots, v_N$, and computes and sends out the coefficients $w_i$ of the output polynomial w(D) at the output port 602 in the order $w_1$ (first), $w_2, \ldots, w_N$. Prior to receiving the first input $v_1$, the contents of the registers $r_1, r_1, \ldots, r_m$ 611-613 are initialized to 0. For i=1, 2, ..., N, the circuit enforces the relation $w_i = \sum_{j=0}^{m} g_j v_{i-j}$ wherein $v_{i-j}$ is interpreted as 0 for i-j<1. Thus, the first output coefficient $w_1$ is given by $w_1=g_0 v_1$; the second output coefficient by $w_2=g_0 v_2 + g_1 v_1$; and the final output coefficient by $w_N=g_0 v_N + g_1 v_{N-1} + \ldots + g_m v_{N-m}$. It takes N time units for the convolution circuit 600 to complete its operation. The convolution circuit 600 is capable of computing the product $w(D)=g(D)v(D) \mod D^N$ in any field. If a coefficient $g_i$ of the fixed polynomial g(D) is zero, it is clear that the corresponding multiplier and adder circuits can be eliminated so as to simplify the circuit. For example, if $g_1=0$, then the multiplier 621 and the adder 631 can be eliminated. A further simplification takes place when $g_i=1$ (the multiplicative identity) in which case the corresponding multiplier can be eliminated. In particular, when the field of operations is the binary field, there is no need for any multipliers and the addition operations can be implemented using logic exclusive OR (XOR) gates. The convolution circuit 600 and its various implementations in digital logic are well known in the prior art.

Figure 7:
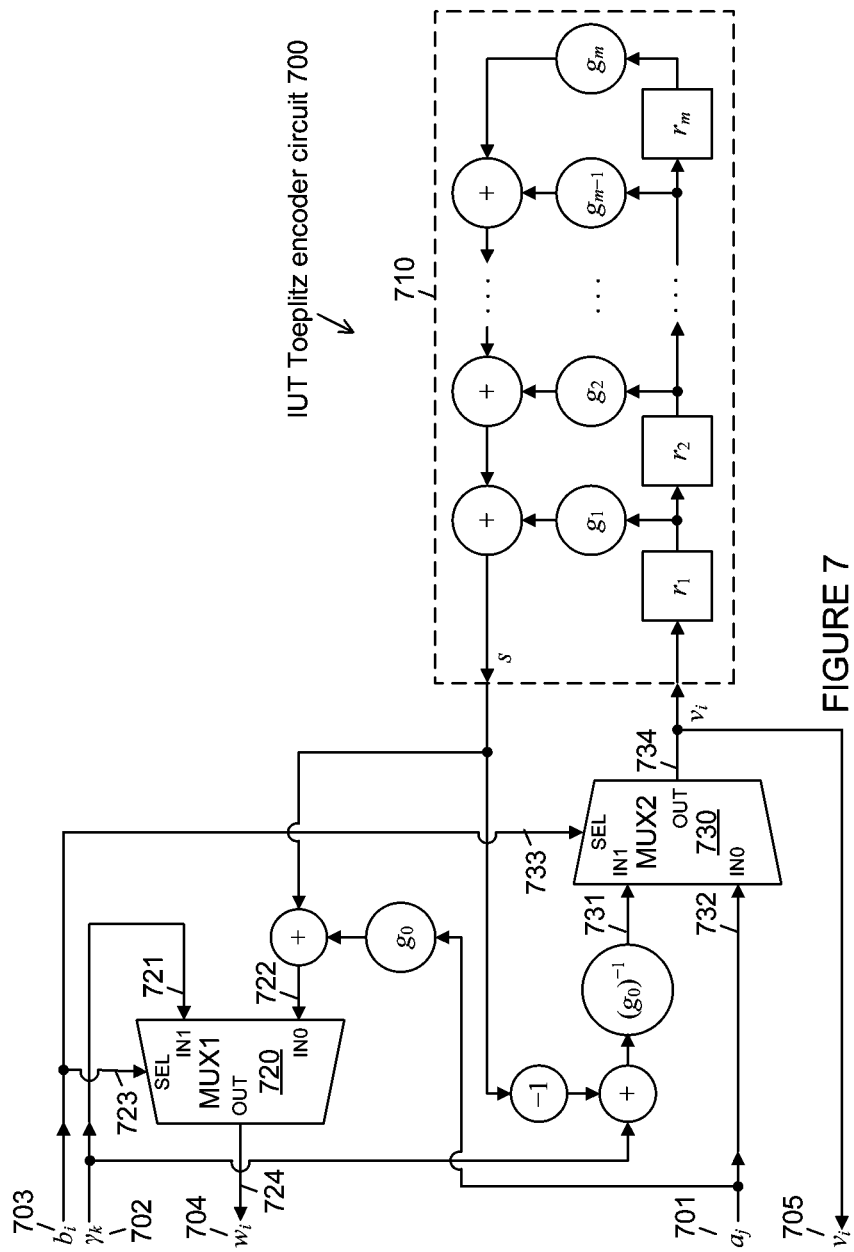
FIG. 7 is a schematic diagram of an IUT Toeplitz encoder circuit 700 according to the present principles.

FIG. 7 is a schematic diagram of an IUT Toeplitz encoder circuit 700 for implementing the outer encoder 302 in accordance with the present principles. The IUT Toeplitz encoder circuit 700 is an implementation of the method 500 in hardware using commonly available digital logic elements, such as adders, multipliers, random access memory, shift registers, and multiplexers. The circuit 700 comprises an FDB input port 701 for receiving elements $a_j$ of the FDB a 313, an OCB input port 702 for receiving elements $\gamma_k$ of the at the OCB γ 312, a CTI input port 703 for receiving elements $b_i$ of the CTI b, a TOB output port 704 for sending out elements $w_i$ of the TOB w 315, and a TIB output port 705 for sending out elements $v_i$ of the TIB v 314.

The circuit 700 further comprises a feed-forward computation circuit 710, a first multiplexer MUX1 720, and a second multiplexer MUX2 730. The circuit 700 follows the steps of the method 500. Certain steps in the implementation of the method 500 are not shown explicitly in the circuit 700 in order not to clutter the circuit 700 with unnecessary detail. In particular, clock circuitry, control logic, and storage elements for holding the FDB a 313, the OCB γ 312, and the CTI b are not shown in the circuit 700. Logic circuits for initialization and incrementing of the counters j, k, i, which are used as memory addresses for fetching the elements $a_j$, $\gamma_k$, and $b_i$ from their respective memory locations, are also not shown in the circuit 700. The person skilled in the art of digital circuit design will have no difficulty is completing such routine details of the control logic for the circuit 700 so as to obtain a full implementation of the method 500.

The feed-forward computation circuit 710 is inspired by the convolution circuit 600. The function of the feed-forward computation circuit 710 is to execute the step 507 of the method 500. The feed-forward computation circuit 710 receives elements $v_i$ of the TIB v 314 as input and generates the feed-forward value $s=\sum_{h=1}^{m} r_h g_h$ as output. The contents of the registers inside the feed-forward computation circuit 710 are initialized to 0 at the start of the operation as in the step 503 of the method 500.

The multiplexers MUX1 720 and MUX2 730 are regular 2-to-1 multiplexers commonly employed in digital circuits. To be specific, the 2-to-1 multiplexer employed here has two input ports IN1 and IN0, a control port SEL, and an output port OUT. When the signal at the control port SEL is a logical 1 (respectively, logical 0), the 2-to-1 multiplexer forwards the logic signal at the input port IN1 (respectively, input port IN0) to the output port OUT.

The constraint-type check step 508 is implemented by connecting the CTI input port 703 to the SEL inputs 723 and 733 of the multiplexers MUX 720 and MUX2 730, respectively.

When $b_i=0$, the first multiplexer MUX1 720 routes the signal $a_j g_0 + s$ from the input port IN0 722 to the output port OUT 724 and the second multiplexer MUX2 730 routes the signal $a_j$ from the input port IN0 732 to the output port OUT 734. Thus, when $b_i=0$, the signal at the TOB output port 704 is obtained as $w_i = a_j g_0 + s$ and the signal at the TIB output port 705 is obtained as $v_i = a_j$, as required by the step 509 of the method 500. When $b_i=0$, the control logic updates the FDB constraint counter j in accordance with the step 511 of the method 500.

When $b_i=1$, the first multiplexer MUX1 720 routes the signal $\gamma_k$ from the input port IN1 721 to the output port OUT 724 and the second multiplexer MUX2 730 routes the signal $(\gamma_k-s)(g_0)^{-1}$ from the input port IN1 731 to the output port OUT 734. Thus, when $b_i=1$, the signal at the TOB output port 704 is obtained as $w_i = \gamma_k$ and the signal at the output port 705 is obtained as $v_i=(\gamma_k-s)(g_0)^{-1}$, as required by the step 510 of the method 500. When $b_i=1$, the control logic updates the OCB constraint counter k in accordance with the step 512 of the method 500.

At the end of the ith round of computation, the signal $v_i$ becomes the next signal at the input to the feed-forward computation circuit 710, while the contents of the registers $r_1, r_2, \ldots, r_{m-1}$ are shifted one place to the right.

Following the above description, the person skilled in the art will have no difficulty in implementing the circuit 700 so that it performs as described in the method 500. The person skilled in the art will also recognize that there exist various alternative realizations of the method 500 which involve pipelining and parallelization in order to decrease the processing latency and improve throughput.

When the outer transform matrix is IUT Toeplitz, it is possible to implement the outer encoder 302 using a transpose-form of the convolution circuit 600. We will now discuss such transpose-form circuits, compare them with the direct-form circuit 600, and give alternative implementations of the outer encoder 302 based on transpose-form convolutions.

Figure 8:
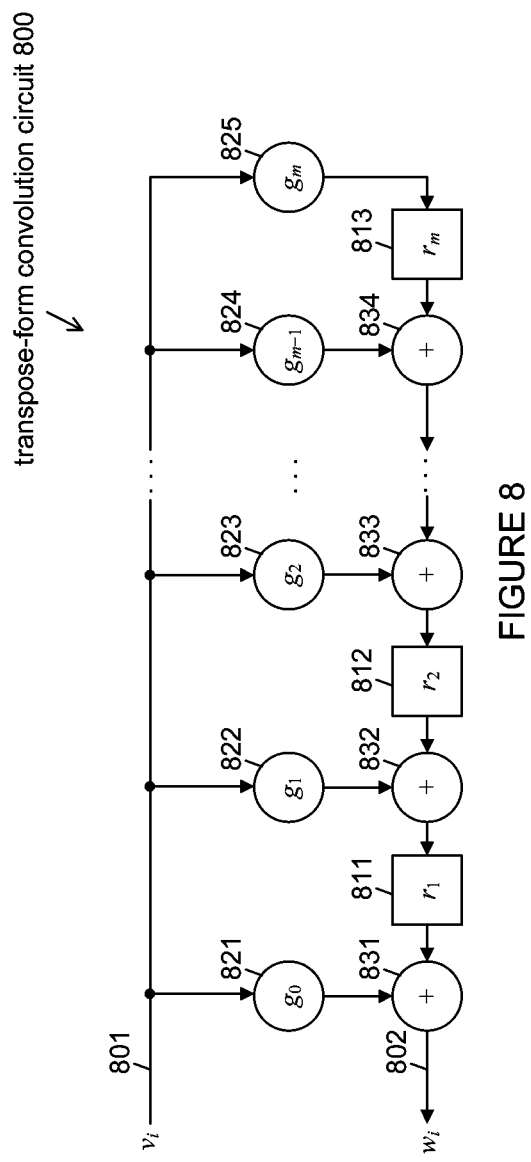
FIG. 8 is a schematic diagram of a transpose-form convolution circuit 800.

FIG. 8 is a schematic diagram of a transpose-form convolution circuit 800. The transpose-form convolution circuit 800 performs the same function as the convolution circuit 600 but may be preferable for having certain implementation advantages. The transpose-form convolution circuit 800 is configured for computing the product $w(D)=v(D)g(D)$ mod $D^N$ as in Proposition 3, wherein $g(D)=g_0+g_1 D + \ldots + g_m D^m$ is fixed polynomial, $$v(D) = v_1 + v_2 D + \ldots + v_N D^{N-1} \text{ and } w(D) = w_1 + w_2 D + \ldots + w_N D^{N-1}$$

are an input polynomial and an output polynomial, respectively.

The transpose-form convolution circuit 800 is obtained from the convolution circuit 600 by Mason's rule (see, e.g., page 156 of the book "A. V. Oppenheim and R. W. Schafer, *Digital Signal Processing*, Prentice-Hall, Englewood Cliffs, N.J., 1975"). The transpose-form convolution circuit 800 comprises an input port 801, an output port 802, registers 811-813, multipliers 821-825, and adders 831-834.

The transpose-form convolution circuit 800 receives the coefficients $v_i$ of the input polynomial v(D) at the input port 801 in the natural order $v_1$ (first), $v_2, \ldots, v_N$, and computes and sends out the coefficients $w_i$ of the output polynomial w(D) at the output port 802 in the order w (first), $w_2, \ldots, w_N$. Prior to receiving the first input $v_1$, the contents of registers $r_1, r_1, \ldots, r_m$ 811-813 are initialized to 0. It takes N time units for the transpose-form convolution circuit 800 to complete its operation. The transpose-form convolution circuit 800 is capable of computing the product $w(D)=g(D)v(D)$ mod $D^N$ in any field. If a coefficient $g_i$ of the fixed polynomial g(D) is zero, it is clear that the corresponding multiplier and adder circuits can be eliminated so as to simplify the circuit. A further simplification takes place when $g_i=1$ (the multiplicative identity) in which case the corresponding multiplier can be eliminated. In particular, when the field of operations is the binary field, there is no need for any multipliers and the addition operations can be implemented using logic exclusive OR (XOR) gates. Details of the operation of the transpose-form convolution circuit 800 and its various implementations in digital logic are well known in the prior art.

It will be clear to the person skilled in the art of digital circuit design that the direct-form convolution circuit 600 (for short, direct-form circuit 600) and the transpose-form convolution circuit 800 (for short, transpose-form circuit 800) have certain advantages and disadvantages relative to each other from an implementation viewpoint. A disadvantage of the direct-form circuit 600 is that it has a larger delay (also called latency or critical path) compared to the transpose-form circuit 800. The delay for the direct-form circuit 600 is determined by the calculation of the output 602, which takes $mT_{add}+T_{mult}$ time units, where Tadd is the delay for an adder and $T_{mult}$ is the delay for a multiplier. In contrast, the delay for the transform-form circuit 800 is $T_{add}+T_{mult}$. Thus, the transpose-form circuit 800 may run with a higher clock frequency compared to the direct-form circuit 600, which is important for high-throughput applications. On the other hand, the person skilled in the art will recognize that it is possible to introduce pipelining to the direct-form circuit 600 and reduce its delay to $T_{add}+T_{mult}$ by adding an extra pipeline register in tandem with each existing register. If the two circuits are compared in terms of fan-out of signals, the input 801 in the transpose-form circuit 800 has fan-out of m, while the direct-form circuit 600 does not use any signals with a fan-out larger than two. When m is large, the fan-out becomes a factor that needs to be taken into consideration.

Figure 9A:
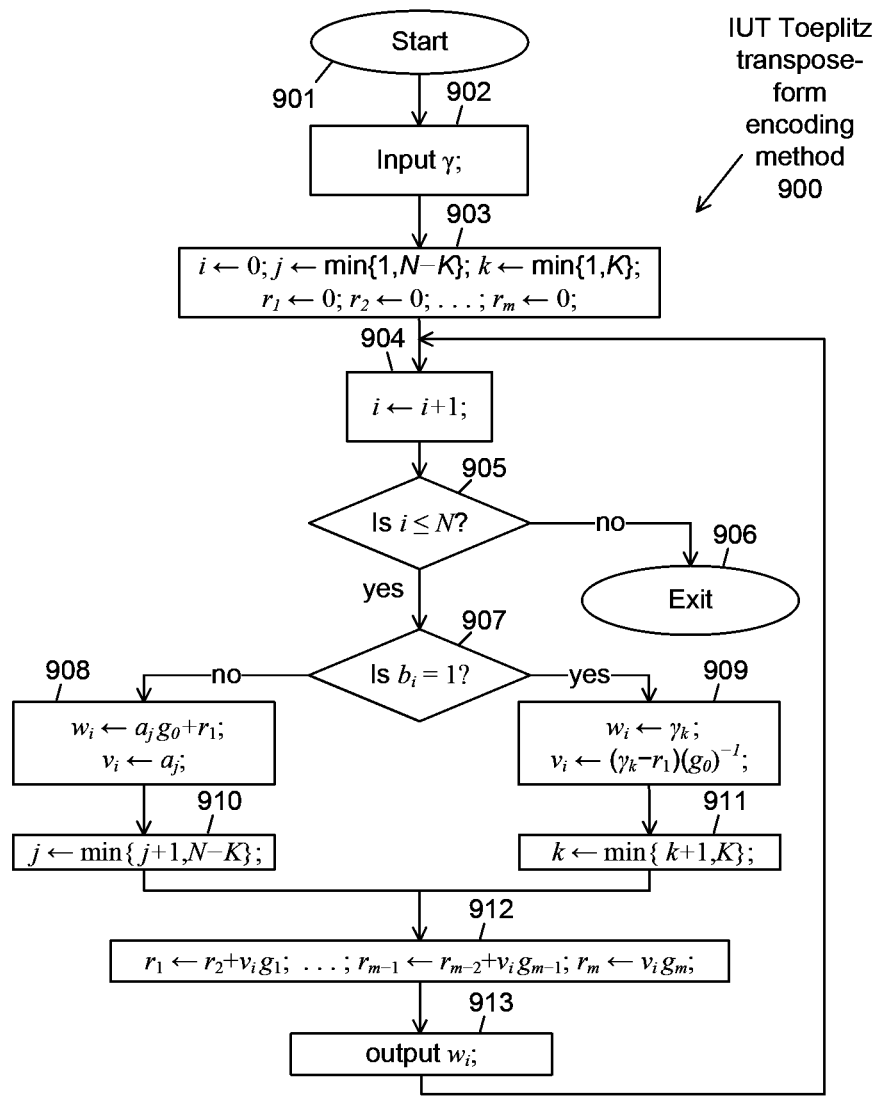
FIG. 9A is a flowchart of an IUT Toeplitz transpose-form encoder method 900 according to the present principles.

FIG. 9A is a flowchart of an IUT Toeplitz transpose-form encoder method 900 according to an embodiment of the present principles. The IUT Toeplitz transpose-form encoding method 900 (hereafter, the method 900) is configured for an IUT Toeplitz matrix $U \in \mathbb{F}_q^{N \times N}$ with an impulse response $g=(g_0, g_1, \ldots, g_m) \in \mathbb{F}_q^{m+1}$, wherein $g_0 \neq 0$ and $g_m \neq 0$. The method 900 begins operations in a start step 901 and moves into an OCB input step 902 when a new OCB $\gamma \in \mathbb{F}_q^K$ 312 becomes available for encoding. In the OCB input step 902, the method 900 fetches the OCB $\gamma$ 312 from outside, e.g., from the inner encoder 301.

Following the OCB input step 902, the method 900 moves to a variable initialization step 903 and initializes a loop counter i, an FDB constraint counter j, an OCB constraint counter k, and a register array $r=(r_1, \ldots, r_m)$ by setting $r_i \leftarrow 0$ for $i=1, \ldots, m$. The counters i, j, and k perform the same counting functions as in the case of the method 400. The role of the register array r is explained below.

As in the case of the method 400, the initialization and updates of the counters j and k can be simplified by removing the "min" operation in the same way as described for the method 400. Such a simplification does not affect the final values of the TIB v 314 and TOB v 315 calculated by the method 900.

Following the variable initialization step 903, the method 900 executes a loop counter increment step 904 by incrementing the loop counter i by 1. The step 904 marks the beginning of a main loop for the method 900. The main loop is executed N times each time the method 900 is invoked. During the ith execution of the main loop, the method 900 processes a feed-forward value s together with a current element $a_j$ of the FDB a 313 or a current element $\gamma_k$ of the OCB $\gamma$ 312 to a generate a next element $v_i$ of the TIB v 314 and a next element $w_i$ of the TOB w 315. The details of the main loop are as follows.

The method 900 enters a loop counter check step 905 following the step 904 and checks if the loop counter i is still less than or equal to its final value N. If a result of the check is NO, the method 900 moves into an exit step 906. (If a next OCB 312 is available for encoding, the exit step 906 may be bypassed and the method 900 may proceed to the encoding of the next OCB by reentering the parameter initialization step 902.)

If the result of the check in the step 905 is YES, the method 900 moves into a constraint-type check step 907 and checks if the next constraint to be processed is an FDB constraint 323 (indicated by $b_i=0$) or an OCB constraint 322 (indicated by $b_i=1$).

If a result of the constraint-type check step 907 is NO, then the method 900 executes an FDB processing step 908 by setting $w_i = a_j g_0 + r_1$ and $v_i = a_j$. The step 908 is followed by a step 910, in which the FDB constraint counter j is updated as $j \leftarrow \min\{j+1, N-K\}$. At the end of the step 910, the FDB constraint counter j points at the next FDB constraint 323 to be processed if there is any left; if all FDB constraints 323 have been processed, the value of j remains as N–K.

If the result of the constraint-type check step 907 is YES, then the method 900 executes an OCB processing step 909 by setting $w_i = \gamma_k$ and $v_i = (\gamma_k - r_1)(g_0)^{-1}$. The step 909 is followed by a step 911, in which the OCB constraint counter k is updated as $k \leftarrow \min\{k+1, K\}$. At the end of the step 911, the OCB constraint counter k points at the next OCB constraint 322 to be processed if there is any left; if all OCB constraints 322 have been processed, the value of k remains as K.

The steps 910 and 911 are both followed by a register update step 912, in which the contents of the register array r are updated as $r_h \leftarrow r_{h+1} + v_i g_h$ in the order $h=1,2,\ldots,m-1$, followed by $r_m \leftarrow v_i g_m$. Here, r plays the role of a feed-forward variable s.

The next step from the step 912 is an output step 913, in which the method 900 outputs the ith element $w_i$ of the TOB w 315. Optionally, the method 500 may output the ith element $v_i$ of the TIB v 314 as part of the output step 913.

Following the output step 913, the method 900 loops back to the step 904 and continues operating as described above.

The complexity of the method 900 is O(mN), which is the same as the complexity of the method 500 but may be significantly smaller than the complexity $O(N^2)$ of the method 400 when m is small compared to N.

It is possible to simplify the method 900 by eliminating all "min" operations as in the case of the method 400. As in the case of the method 400, another simplification takes place in the implementation of the method 900 when the diagonal elements of the IUT transform U are all 1 (the multiplicative identity in $\mathbb{F}_q$) or when the transform operations are over the binary field $\mathbb{F}_2 = \{0,1\}$.

FIG. 9B is a diagram illustrating in tabular form an exemplary calculation 950 according to the method 900. The exemplary calculation 950 uses an exemplary transform matrix U 952, an exemplary CTI b 953, an exemplary FDB a 954, and an exemplary OCB $\gamma$ 955. The exemplary calculation 950 is assumed to be over the binary field $\mathbb{F}_2$. By inspecting the exemplary parameters b 953 and a 954, we understand that the length parameters in the exemplary calculation 950 are N=8 and K=3. Details of the exemplary calculation 950 are shown in a table 951. The ith row of the table 951 lists values of the variables of the method 900, where the values are sampled immediately after completion of the FDB constraint processing step 908 or the OCB constraint processing step 909. At the end of the exemplary calculation 950, an exemplary TIB v 956 and an exemplary TOB w 957 are obtained. It can be verified easily that the exemplary variables 952-957 satisfy the transform constraint w=vU 321, the FDB constraint $v_{\mathcal{A}^c} = a$ 322, and the OCB constraint $w_{\mathcal{A}} = \gamma$ 323 with $\mathcal{A}=\{4,6,8\}$ and $\mathcal{A}^c=\{1,2,3,5,7\}$.

Note that the input parameters for the exemplary calculation 550 and the exemplary calculation 950 are the identical. As expected, both 550 and 950 produce as outputs the same TIB v 314 and the same TOB w 315.

Next, we give a hardware implementation of the method 900 based on the transpose-form convolution circuit 800.

Figure 10:
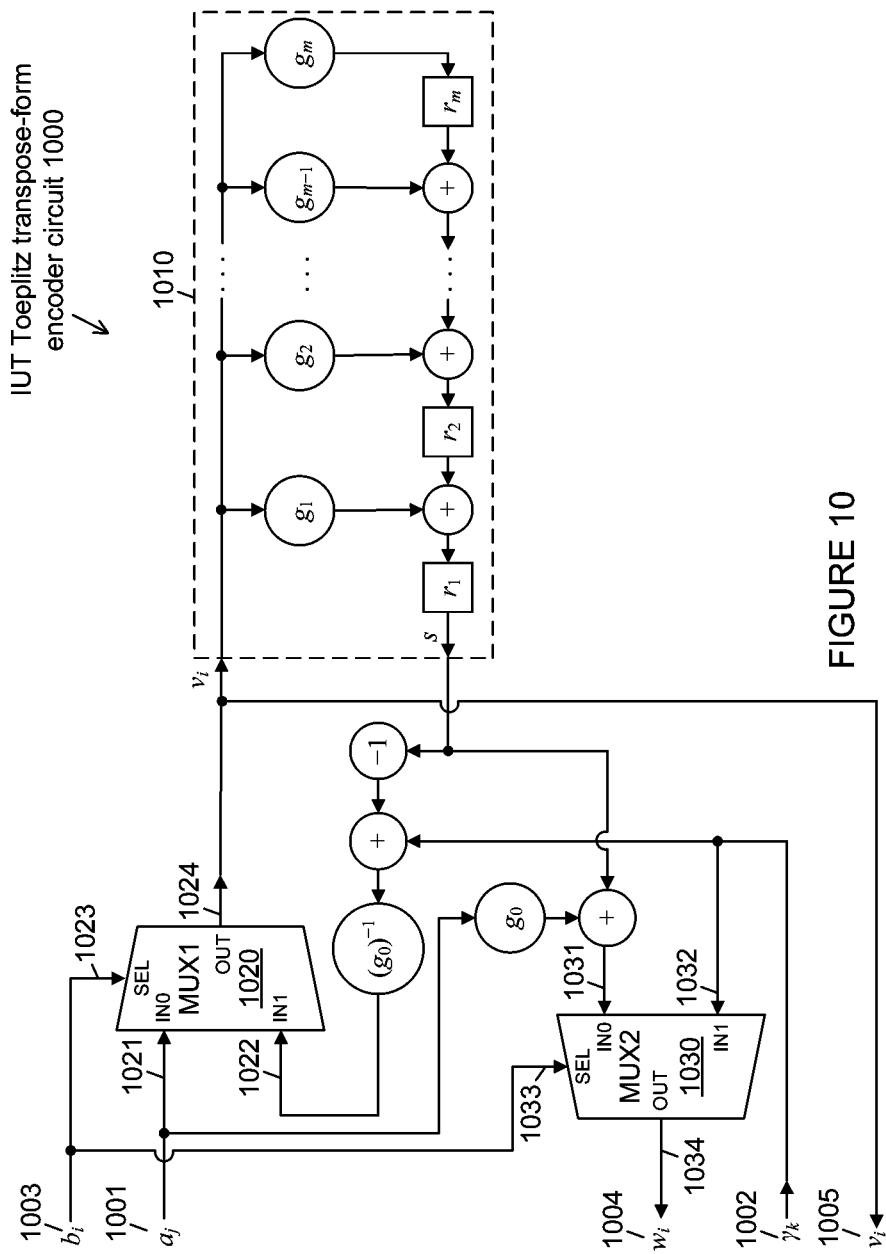
FIG. 10 is a schematic diagram of a transpose-form IUT Toeplitz encoder circuit 1000 according to the present principles.

FIG. 10 is a schematic diagram of a transpose-form IUT Toeplitz encoder circuit 1000 according to an embodiment of the present principles. The transpose-form IUT Toeplitz encoder circuit 1000 (hereafter, the circuit 1000) is an implementation of the method 900 in hardware using commonly available digital logic elements, such as adders, multipliers, random access memory, shift registers, and multiplexers. The circuit 1000 comprises an FDB input port 1001 for receiving the elements $a_j$ of the FDB a 313, an OCB input port 1002 for receiving the elements $\gamma_k$ of the OCB $\gamma$ 312, a CTI input port 1003 for receiving the elements $b_i$ of the CTI b, a TOB output port 1004 for sending out the elements $w_i$ of the TOB w 315, and a TIB output port 1005 for sending out the elements $v_i$ of the TIB v 314.

The circuit 1000 further comprises a transpose-form feed-forward calculation circuit 1010, a first multiplexer MUX1 1020, and second multiplexer MUX2 1030. The circuit 1000 follows the steps of the method 900. Certain steps in the implementation of the method 900 are not shown explicitly in the circuit 1000 in order not to clutter the circuit 1000 with unnecessary detail. In particular, clock circuitry, control logic, and storage elements for holding the FDB a 313, the OCB γ 312, and the CTI b are not shown in the circuit 1000. Logic circuits for initialization and incrementing of the counters j, k, i, which are used as memory addresses for fetching the elements $\beta_j$, $\gamma_k$, and $b_i$ from their respective memory locations, are also not shown in the circuit 1000. The person skilled in the art of digital circuit design will have no difficulty is completing such routine details of the circuit 1000 so as to obtain a full implementation of the method 900.

The transpose-form feed-forward computation circuit 1010 is inspired by the transpose-form convolution circuit 800. The function of the transpose-form feed-forward computation circuit 1010 is to execute the step 912 of the method 900. The transpose-form feed-forward computation circuit 1010 receives elements $v_i$ of the TIB v 314 as input and generates $r_1$ as the feed-forward variable s at its output. The contents of the registers inside the transpose-form feed-forward computation circuit 1010 are initialized to 0 at the start of the operation as in the step 903 of the method 900.

The multiplexers MUX1 1020 and MUX2 1030 are regular 2-to-1 multiplexers commonly employed in digital circuits. To be specific, the 2-to-1 multiplexer employed here has two input ports IN1 and IN0, a control port SEL, and an output port OUT. When the signal at the control port SEL is a logical 1 (respectively, logical 0), the 2-to-1 multiplexer forwards the logic signal at the input port IN1 (respectively, input port IN0) to the output port OUT.

The constraint-type check step 907 is implemented by connecting the CTI input port 1003 to the SEL ports 1023 and 1033 of the multiplexers MUX 1020 and MUX2 1030, respectively.

When $b_i$=0, the first multiplexer MUX1 1020 routes the signal a from the input port IN0 1021 to the output port OUT 1024 and the second multiplexer MUX2 1030 routes the signal $a_j g_0 + r_1$ from the input port IN0 1031 to the output port OUT 1034. Thus, when $b_i$=0, the signal at the TOB output port 1004 is obtained as $w_i = a_j g_0 + r_1$ and the signal at the TIB output port 1005 is obtained as $v_i = a_j$, as required by the step 908 of the method 900. When $b_i$=0, the control logic updates the FDB constraint counter j in accordance with the step 910 of the method 900.

When $b_i$=1, the first multiplexer MUX1 1020 routes the signal $(\gamma_k - r_1)(g_0)^{-1}$ from the input port IN1 1022 to the output port OUT 1024 and the second multiplexer MUX2 1030 routes the signal $\gamma_k$ from the input port IN 1032 to the output port OUT 1034. Thus, when $b_i$=1, the signal at the TOB output port 1004 is obtained as $w_i = \gamma_k$ and the signal at the TIB output port 1005 is obtained as $v_i = (\gamma_k - r_1)(g_0)^{-1}$, as required by the step 909 of the method 900. When $b_i$=1, the control logic updates the OCB constraint counter k in accordance with the step 911 of the method 900.

At the end of the ith round of computation, the signal $v_i$ becomes the next input to the transpose-form feed-forward computation circuit 1010, while the contents of the registers $r_1, r_2, \ldots, r_{m-1}$ are updated in accordance with the step 912 of the method 900. Following the above description, the person skilled in the art will have no difficulty in implementing the circuit 1000 so that it performs as described in the method 900. The person skilled in the art will also recognize various alternative realizations of the method 900 which involve pipelining and parallelization in order to decrease the processing latency and improve throughput.

The embodiments of the present principles described above can be modified or extended in several ways to obtain alternative embodiments. We will list some such alternatives.

In some implementations of the outer encoder 302 it may be preferable to use dual methods. The idea of dual methods is to replace a primal set of parameters (U, $\mathcal{A}$, a, γ, v, w) for the outer encoder 302 with a dual set of parameters ($U^{-1}$, $\mathcal{A}^c$, γ, a, w, v). In the dual method, the methods discussed above are applied to the dual case. We will state two basic results that form the foundation of the dual methods.

Proposition 4. For any N≥1, the class of all N-by-N IUT matrices forms a group under matrix multiplication; in other words, the product of two IUT matrices is an IUT matrix and the inverse of IUT matrix is an IUT matrix.

We omit the proof of Proposition 4 since it is a well-known result.

Proposition 5. The class of all N-by-N IUT Toeplitz matrices forms a group under matrix multiplication. Let U∈ $\mathbb{F}_q^{N \times N}$ be an IUT Toeplitz matrix with first row g=($g_0$, $g_1$, ..., $g_{N-1}$)∈ $\mathbb{F}_q^N$. Then, $U^{-1}$ is an IUT Toeplitz matrix with a first row h=($h_0$, $h_1$, ..., $h_{N-1}$)∈ $\mathbb{F}_q^N$ given by the recursive formulas $h_0 = (1/g_0)$ and $$h_k = -\frac{1}{g_0} \sum_{i=1}^{k} g_{k-i} h_i$$

for k=1, 2, ..., N−1. Equivalently, the polynomials $$g(D) = g_0 + g_1 D + \ldots + g_{N-1} D^{N-1} \text{ and } h(D) = h_0 + h_1 D + \ldots + h_{N-1} D^{N-1}$$

are related by h(D)=[1/g(D)] mod $D^N$.

We omit the proof of Proposition 5 since it is a known result (see, e.g., D. Commenges and M. Monsion, "Fast inversion of triangular Toeplitz matrices," IEEE Transactions on Automatic Control, vol. 29, no. 3, pp. 250-251, March 1984). The following example shows that the dual Toeplitz transform may be less complex to implement in some cases.

Example. Let U∈ $\mathbb{F}_2^{16 \times 16}$ be an IUT Toeplitz matrix with first row g=(1,1,1,1, 0, 0, 0, 0, 1, 1, 0, 1, 1, 0, 1, 0). By Proposition 5, the inverse $U^{-1}$∈ $\mathbb{F}_2^{16 \times 16}$ is the IUT Toeplitz matrix with first row h=(1,1, 0, 0, 1, 1, 0, 0, 0, 0, 1, 0, 0, 0, 0, 0). We observe that g(D) has degree 14 while h(D) has degree 10. Thus, implementing the circuits 700 and 1000 using the dual polynomial h(D) requires 10 shift registers compared to 14 if g(D) is used.

We leave out the details of dual methods for implementing the outer encoder 302 since the person skilled in the art will have no difficulty in implementing such methods from the above description. Next, we turn to another direction in which the present principles may be extended.

In the above embodiments of the present principles, as presented, e.g., in FIG. 3, we have assumed that the outer transform matrix is an IUT matrix and the inner transform is an ILT matrix. The person skilled in the art will readily see that the present principles can be applied to carry out systematic encoding for any code whose generator matrix G splits into a product G=AB of an outer transform A and an inner transform B where A=PUQ and B=RLS for some IUT matrix U, ILT matrix L, and permutation matrices P, Q, R, S. The person skilled in the art will be able to modify the systematic encoder 300 (and its more specific embodiments presented in FIGS. 4A, 5A, 7, 9A, and 10) to implement a systematic encoder based on the modified triangular factorization G=AB.

Another extension of the present principles is the following. In the above treatment of systematic encoding of TF codes, we have assumed that the various transforms under consideration are represented by square matrices. The present principles can be extended to the case where systematic encoding is desired for a code with a generator matrix where the generator matrix is specified as a non-square matrix. In such a case, the non-square generator matrix may be augmented by extra rows or columns to turn it into a square matrix and a triangular factorization of the resulting square matrix can be used in connection with the present principles to obtain a systematic encoder for the code. All such embodiments that explicitly or implicitly use the present principles fall within the scope of the present principles.

Finally, we note that the present principles can be readily used for code shortening. Shortening is a method of providing flexibility with respect to the length of a code. Several code families have some natural code lengths dictated by the way the code is constructed. The natural code lengths for a given code may not suit the special requirements of particular applications, in which case it is desirable to have a method for adjusting the code lengths. In shortening, a portion of the TCB is set equal to a fixed shortening block (FSB), where the FSB is a fixed pattern of symbols (usually, a pattern of all-zeros). The TCB is shortened by not sending the FSB over the transmission channel. When shortening is applied, it is common practice to ensure that the decoder in the system knows the FSB so that it can restore the missing part of the TCB before starting the decoding task.

For joint shortening and systematic encoding of TF codes, the present principles can be applied by embedding the FSB into the SDB. If shortening is desired with non-systematic encoding of TF codes, then the SDB may be embedded into the FDB and systematic encoding according to the present principles can be carried out with the FSB embedded into the TCB (as if it were the SDB).

This completes our description of various embodiments of the present principles. We now turn to some examples of communication systems within which the present principles may be used.

Figure 11:
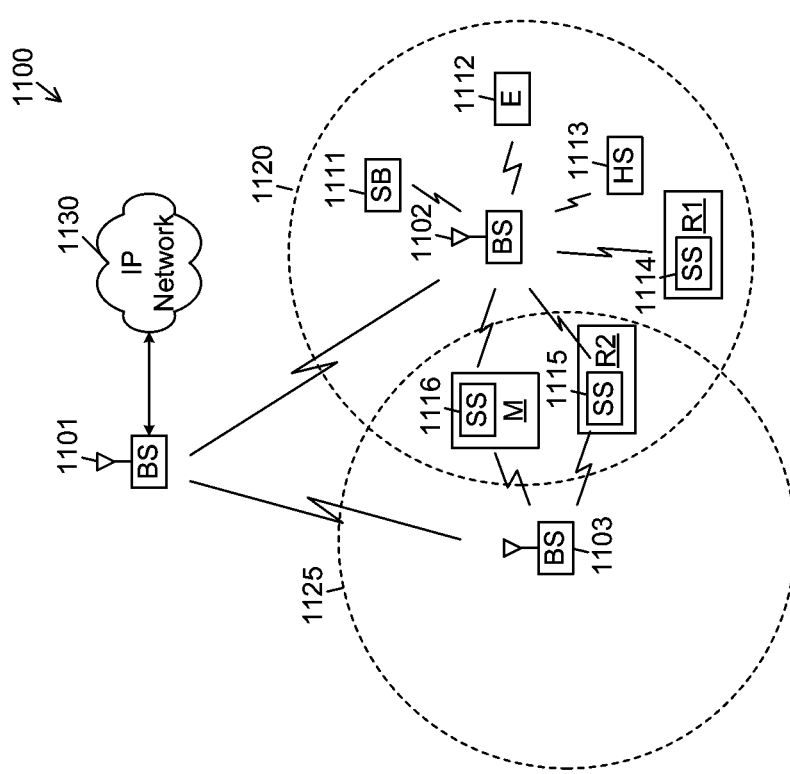
FIG. 11 illustrates an example wireless network within which systematic encoding of data in error correction coding using triangular factorization of generator matrix may be implemented according to this disclosure.

FIG. 11 illustrates an example wireless network within which data encoding in error correction coding using triangular transforms may be implemented according to this disclosure. The embodiment of the wireless network 1100 shown in FIG. 11 is for illustration only. Other embodiments of the wireless network 1100 could be used without departing from the scope of this disclosure. The wireless network 1100 includes an eNodeB (eNB) 1101, an eNB 1102, and an eNB 1103. The eNB 1101 communicates with the eNB 1102 and the eNB 1103. The eNB 1101 also communicates with at least one Internet Protocol (IP) network 1130, such as the Internet, a proprietary IP network, or other data network.

Depending on the network type, other well-known terms may be used instead of "eNodeB" or "eNB," such as "base station" or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station" (or "MS"), "subscriber station" (or "SS"), "remote terminal," "wireless terminal," or "user device." For the sake of convenience, the terms "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

The eNB 1102 provides wireless broadband access to the network 1130 for a first plurality of user equipments (UEs) within a coverage area 1120 of the eNB 1102. The first plurality of UEs includes a UE 1111, which may be located in a small business (SB); a UE 1112, which may be located in an enterprise (E); a UE 1113, which may be located in a WiFi hotspot (HS); a UE 1114, which may be located in a first residence (R1); a UE 1115, which may be located in a second residence (R2); and a UE 1116, which may be a mobile device (M) like a cell phone, a wireless laptop, a wireless personal digital assistant (PDA), tablet, or the like. The eNB 1103 provides wireless broadband access to the network 1130 for a second plurality of UEs within a coverage area 1125 of the eNB 1103. The second plurality of UEs includes the UE 1115 and the UE 1116. In some embodiments, one or more of the eNBs 1101-1103 may communicate with each other and with the UEs 1111-1116 using 3G, 4G or 5G, long-term evolution (LTE), LTE-A, WiMAX, or other advanced wireless communication techniques.

Dotted lines show the approximate extents of the coverage areas 1120 and 1125, which are shown as approximately circular for the purposes of illustration and explanation only. It should be clearly understood that the coverage areas associated with eNBs, such as the coverage areas 1120 and 1125, may have other shapes, including irregular shapes, depending upon the configuration of the eNBs and variations in the radio environment associated with natural and man-made obstructions.

As described in more detail below, one or more of eNB 1101, eNB 1102 and eNB 1103 include 2D antenna arrays as described in embodiments of the present disclosure. In some embodiments, one or more of eNB 1101, eNB 1102 and eNB 1103 support the codebook design and structure for systems having 2D antenna arrays.

Although FIG. 11 illustrates one example of a wireless network 1100, various changes may be made to FIG. 11. For example, the wireless network 1100 could include any number of eNBs and any number of UEs in any suitable arrangement. Also, the eNB 1101 could communicate directly with any number of UEs and provide those UEs with wireless broadband access to the network 1130. Similarly, each eNB 1102-1103 could communicate directly with the network 1130 and provide UEs with direct wireless broadband access to the network 1130. Further, the eNB 1101, 1102, and/or 1103 could provide access to other or additional external networks, such as external telephone networks or other types of data networks.

The example channel decoding systems depicted in the figures and described above may be implemented in an eNB (such as eNB 1102) and/or a UE (such as UE 1116), as described in further detail below.

Figure 12A:
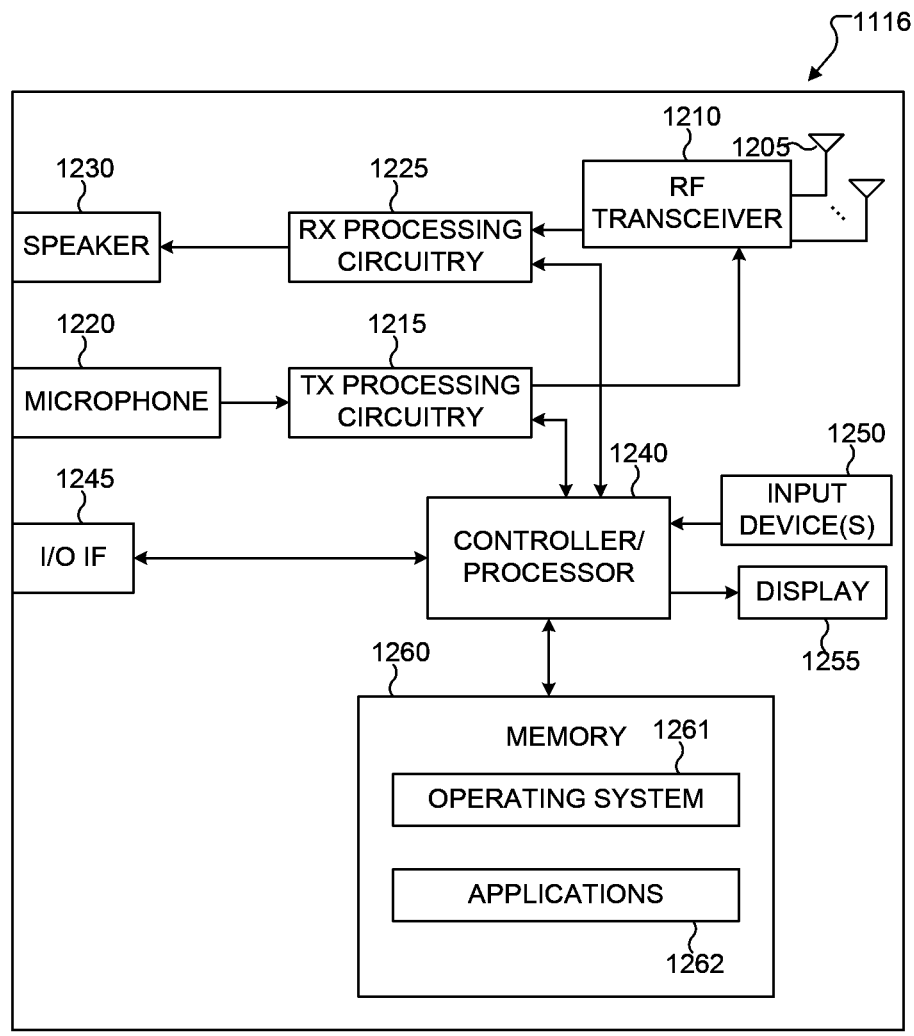
FIG. 12A illustrates an example user equipment network within which systematic encoding of data in error correction coding using triangular factorization of generator matrix may be implemented according to this disclosure.

FIG. 12A illustrates an example user equipment network within which data encoding in error correction coding using triangular transforms may be implemented according to this disclosure. The embodiment of the UE 1116 illustrated in FIG. 12A is for illustration only, and the UEs 1111-1115 of FIG. 11 could have the same or similar configuration. However, UEs come in a wide variety of configurations, and FIG. 12A does not limit the scope of this disclosure to any particular implementation of a UE.

The UE 1116 includes an antenna 1205, a radio frequency (RF) transceiver 1210, transmit (TX) processing circuitry 1215 (which may include the encoder 110 in FIG. 1), a microphone 1220, and receive (RX) processing circuitry 1225 (which may include the decoder 130 in FIG. 1). The UE 1116 also includes a speaker 1230, a main processor 1240, an input/output (IO) interface (IF) 1245, a keypad 1250, a display 1255, and a memory 1260. The memory 1260 includes a basic operating system (OS) program 1261 and one or more applications 1262. Either the OS program 1261, one of the applications 1262, or some combination thereof may implement programming for employing error correction coding as described in the various embodiments of FIGS. 1 through 10.

The RE transceiver 1210 receives, from the antenna 1205, an incoming RE signal transmitted by an eNB of the network 1100. The RF transceiver 1210 may down-convert the incoming RE signal to generate an intermediate frequency (IF) or baseband signal which would be sent to the receiver (Rx) processing circuitry 1225. The Rx processing circuitry 1225 transmits the processed signal to the speaker 1230 (such as for voice data) or to the main processor 1240 for further processing (such as for web browsing data).

The transmit (Tx) processing circuitry 1215 receives, as at least some input data for the source data block, analog or digital voice data from the microphone 1220 or other outgoing baseband data (such as web data, e-mail, or interactive video game data) from the main processor 1240. The Tx processing circuitry 1215 implements encoding. The RE transceiver 1210 receives the outgoing processed baseband or IF signal from the Tx processing circuitry 1215 and up-converts the baseband or IF signal to an RF signal that is transmitted via the antenna 1205.

The main processor 1240 can include one or more processors or other processing devices and execute the basic OS program 1261 stored in the memory 1260 in order to control the overall operation of the UE 1116. For example, the main processor 1240 could control the reception of forward channel signals and the transmission of reverse channel signals by the RF transceiver 1210, the Rx processing circuitry 1225, and the Tx processing circuitry 1215 in accordance with well-known principles. In some embodiments, the main processor 1240 includes at least one programmable microprocessor or microcontroller, while in other embodiments the main processor includes dedicated circuitry (e.g., for systematic and/or non-systematic encoding or decoding processes, shortening processes, data mapping, etc.) as well as (optionally) programmable logic or processing circuits.

The main processor 1240 is also capable of executing other processes and programs resident in the memory 1260, such as operations for channel quality measurement and reporting for systems having 2D antenna arrays. The main processor 1240 can move data and/or instructions into or out of the memory 1260 as required by an executing process. In some embodiments, the main processor 1240 is configured to execute the applications 1262 based on the OS program 1261 or in response to signals received from eNBs or an operator. The main processor 1240 is also coupled to the I/O interface 1245, which provides the UE 1116 with the ability to connect to other devices such as laptop computers and handheld computers. The I/O interface 1245 is the communication path between these accessories and the main controller 1240.

The main processor 1240 is also coupled to the keypad 1250 (which may simply be a single button or may be an array or other set of buttons) and the display unit 1255. The operator of the UE 1116 can use the keypad 1250 to enter data into the UE 1116. The display 1255 may be a touch screen display or other display capable of rendering text and/or at least limited graphics, such as from web sites, and receiving touch inputs by a user in accordance with known practices.

The memory 1260 is coupled to the main processor 1240, and at least a part of the memory 1260 could include a random access memory (RAM), and another part of the memory 1260 could include a Flash memory or other read-only memory (ROM).

Although FIG. 12A illustrates one example of UE 1116, various changes may be made to FIG. 12A. For example, various components in FIG. 12A could be combined, further subdivided, or omitted and additional components could be added according to particular needs. As a particular example, the main processor 1240 could be divided into multiple processors, such as one or more central processing units (CPUs), one or more application specific integrated circuits (ASICs), one or more field programmable gate arrays (FPGAs), and one or more graphics processing units (GPUs). Also, while FIG. 12A illustrates the UE 1116 configured as a mobile telephone or smartphone, UEs could be configured to operate as other types of mobile or stationary devices.

Figure 12B:
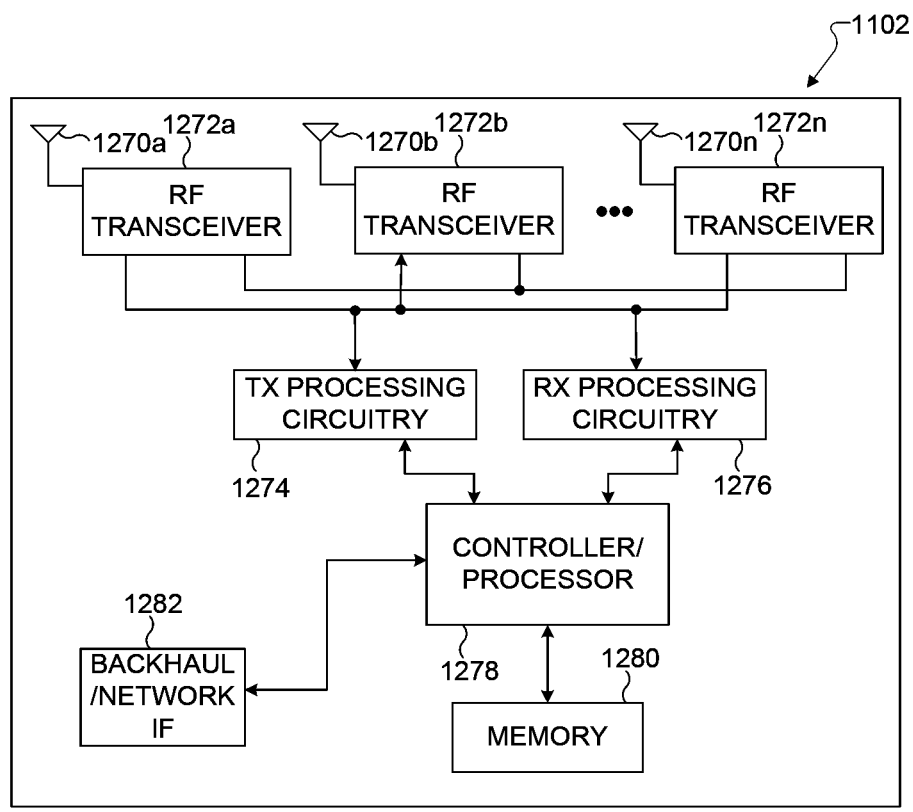
FIG. 12B illustrates an example enhanced NodeB (eNB) network within which systematic encoding of data in error correction coding using triangular factorization of generator matrix may be implemented according to this disclosure.

FIG. 12B illustrates an example enhanced NodeB (eNB) network within which data encoding in error correction coding using triangular transforms may be implemented according to this disclosure. The embodiment of the eNB 1102 shown in FIG. 12B is for illustration only, and other eNBs of FIG. 11 could have the same or similar configuration. However, eNBs come in a wide variety of configurations, and FIG. 12B does not limit the scope of this disclosure to any particular implementation of an eNB. It is noted that eNB 1101 and eNB 1103 can include the same or similar structure as eNB 1102.

As shown in FIG. 12B, the eNB 1102 includes multiple antennas 1270a-1270n, multiple RF transceivers 1272a-1272n, transmit (Tx) processing circuitry 1274, and receive (Rx) processing circuitry 1276. In certain embodiments, one or more of the multiple antennas 1270a-1270n include 2D antenna arrays. The eNB 1102 also includes a controller/processor 1278, a memory 1280, and a backhaul or network interface 1282.

The RF transceivers 1272a-1272n receive, from the antennas 1270a-1270n, incoming RF signals, such as signals transmitted by UEs or other eNBs. The RF transceivers 1272a-1272n down-convert the incoming RF signals to generate IF or baseband signals. The IF or baseband signals are sent to the Rx processing circuitry 1276, which generates processed signals by filtering, decoding, and/or digitizing the baseband or IF signals. The Rx processing circuitry 1276 transmits the processed signals to the controller/processor 1278 for further processing.

The Tx processing circuitry 1274 receives, as at least some input data for source data blocks, analog or digital data (such as voice data, web data, e-mail, or interactive video game data) from the controller/processor 1278. The Tx processing circuitry 1274 implements circuits to encode, multiplex, and/or digitize the outgoing baseband data to generate processed signals. The RE transceivers 1272a-1272n receive the outgoing processed signals from the Tx processing circuitry 1274 and up-converts the baseband or IF signals to RE signals that are transmitted via the antennas 1270a-1270n.

The controller/processor 1278 can include one or more processors or other processing devices that control the overall operation of the eNB 1102. For example, the controller/processor 1278 could control the reception of forward channel signals and the transmission of reverse channel signals by the RE transceivers 1272a-1272n, the Rx processing circuitry 1276, and the Tx processing circuitry 1274 in accordance with well-known principles. The controller/processor 1278 could support additional functions as well, such as more advanced wireless communication functions. Any of a wide variety of other functions could be supported in the eNB 1102 by the controller/processor 1278. In some embodiments, the controller/processor 1278 includes at least one microprocessor or microcontroller, while in other embodiments the main processor includes dedicated circuitry (e.g., for systematic and/or non-systematic encoding processes, shortening processes, data mapping, etc.) as well as (optionally) programmable logic or processing circuits.

The controller/processor 1278 is also capable of executing programs and other processes resident in the memory 1280, such as a basic OS. The controller/processor 1278 is also capable of supporting channel quality measurement and reporting for systems having 2D antenna arrays. In some embodiments, the controller/processor 1278 supports communications between entities. The controller/processor 1278 can move data and/or instructions into or out of the memory 1280 as required by an executing process.

The controller/processor 1278 is also coupled to the backhaul or network interface 1282. The backhaul or network interface 1282 allows the eNB 1102 to communicate with other devices or systems over a backhaul connection or over a network. The interface 1282 could support communications over any suitable wired or wireless connection(s). For example, when the eNB 1102 is implemented as part of a cellular communication system (such as one supporting 3G, 4G, 5G, LTE, or LTE-A), the interface 1282 could allow the eNB 1102 to communicate with other eNBs over a wired or wireless backhaul connection. When the eNB 1102 is implemented as an access point, the interface 1282 could allow the eNB 1102 to communicate over a wired or wireless local area network or over a wired or wireless connection to a larger network (such as the Internet). The interface 1282 includes any suitable structure supporting communications over a wired or wireless connection, such as an Ethernet or RF transceiver.

The memory 1280 is coupled to the controller/processor 1278. Part of the memory 1280 could include a RAM, and another part of the memory 1280 could include a Flash memory or other ROM. In certain embodiments, a plurality of instructions is stored in memory. The instructions are configured to cause the controller/processor 1278 to perform the systematic and/or non-systematic encoding or decoding processes, shortening processes, data mapping, etc.

Although FIG. 12B illustrates one example of an eNB 1102, various changes may be made to FIG. 12B. For example, the eNB 1102 could include any number of each component shown. As a particular example, an access point could include a number of interfaces 1282, and the controller/processor 1278 could support routing functions to route data between different network addresses. As another particular example, while shown as including a single instance of Tx processing circuitry 1274 and a single instance of Rx processing circuitry 1276, the eNB 1102 could include multiple instances of each (such as one per RF transceiver).

While particular embodiments of METHODS AND APPARATUS FOR SYSTEMATIC ENCODING OF DATA IN ERROR CORRECTION CODING USING TRIANGULAR FACTORIZATION OF GENERATOR MATRIX are herein described in detail and depicted in the drawings, it is to be understood that the subject matter which is encompassed by the present disclosure is limited only by the claims. Although the present disclosure has been described with exemplary embodiments, various changes and modifications may be suggested to one skilled in the art. It is intended that the present disclosure encompass such changes and modifications that fall within the scope of the appended claims. The description in the present application should not be read as implying that any particular element, step, or function is an essential or critical element which must be included in the claim scope: the scope of patented subject matter is defined only by the allowed claims. Moreover, none of these claims are intended to invoke 35 USC § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

What is claimed is:

1. A systematic encoder apparatus for use in a communication system for reliable transfer of a source data block (SDB), the systematic encoder apparatus configured for an outer transform matrix and an inner transform matrix, the systematic encoder apparatus comprising:
    an inner encoder; and
    an outer encoder,
    wherein the inner encoder is configured to receive the SDB and generate an output constraint block (OCB) as an image of the SDB under an inverse of a submatrix of the inner transform matrix,
    wherein the outer encoder is configured to receive a fixed data block (FDB) and the OCB and generate a transform output block (TOB) subject to a first systematic coding constraint that the TOB is an image of a transform input block (TIB) under the outer transform matrix, a second systematic coding constraint that the TOB contains the OCB transparently in a sub-block of the TOB, and a third systematic coding constraint that the TIB contains the FDB transparently in a sub-block of the TIB,
    wherein the inner encoder is further configured to receive the TOB and generate a transmitted code block (TCB) subject to a fourth systematic coding constraint that the TCB is an image of the TOB under the inner transform matrix and a fifth systematic coding constraint that the TCB contains the SDB transparently in a sub-block of the TCB.

2. The systematic encoding apparatus of claim 1, wherein the outer transform matrix is an invertible upper triangular (IUT) matrix,
    wherein the sub-block of the TOB comprises elements of the TOB whose indices belong to an index set, and
    wherein the sub-block of the TIB comprises elements of the TIB whose indices belong to a complement of the index set.

3. The systematic encoding apparatus of claim 2, wherein the inner transform matrix is an invertible lower triangular (ILT) matrix,
  wherein the submatrix of the inner transform matrix comprises elements of the inner transform matrix whose column indices belong to the index set and whose row indices belong to the index set, and
  wherein the sub-block of the TCB comprises elements of the TCB whose indices belong to the index set.

4. The systematic encoder apparatus of claim 2, wherein the outer encoder comprises a feed-forward computation circuit, and
  wherein the feed-forward computation circuit is configured to receive a sequence of TIB elements and, for each TIB element received, produce a feed-forward value.

5. The systematic encoder apparatus of claim 4, wherein the outer transform matrix is an IUT Toeplitz matrix, and
  wherein the feed-forward computation circuit comprises a convolution circuit, the convolution circuit comprising a plurality of registers, multipliers, and adders, the convolution circuit being configured in accordance with an impulse response, the impulse response being derived from a first row of the IUT Toeplitz matrix.

6. The systematic encoder apparatus of claim 5, wherein the outer encoder is further configured to use the feed-forward value together with a current element of the FDB or a current element of the OCB to generate a next element of the TIB and a next element of the TOB.

7. A method for use in a communication system for reliable transfer of a source data block (SDB), the method employing a systematic encoder apparatus configured for an outer transform matrix and an inner transform matrix, the method comprising:
  configuring an inner encoder to receive the SDB and generate an output constraint block (OCB) as an image of the SDB under an inverse of a submatrix of the inner transform matrix; and
  configuring an outer encoder to receive a fixed data block (FDB) and the OCB and generate a transform output block (TOB) subject to a first systematic coding constraint that the TOB is an image of a transform input block (TIB) under the outer transform matrix, a second systematic coding constraint that the TOB contains the OCB transparently in a sub-block of the TOB, and a third systematic coding constraint that the TIB contains the FDB transparently in a sub-block of the TIB,
  wherein the inner encoder is further configured to receive the TOB and generate a transmitted code block (TCB) subject to a fourth systematic coding constraint that the TCB is an image of the TOB under the inner transform matrix and a fifth systematic coding constraint that the TCB contains the SDB transparently in a sub-block of the TCB.

8. The method of claim 7, wherein the outer transform matrix is an invertible upper-triangular (IUT) matrix,
  wherein the sub-block of the TOB comprises elements of the TOB whose indices belong to an index set, and
  wherein the sub-block of the TIB comprises elements of the TIB whose indices belong to a complement of the index set.

9. The method of claim 8, wherein the inner transform matrix is an invertible lower-triangular (ILT) matrix,
  wherein the submatrix of the inner transform matrix comprises elements of the inner transform matrix whose row indices belong to the index set and whose column indices belong to the index set, and
  wherein the sub-block of the TCB comprises elements of the TCB whose indices belong to the index set.

10. The method of claim 9, wherein the outer encoder comprises a feed-forward computation circuit, and wherein the feed-forward computation circuit is configured to receive a sequence of TIB elements and, for each TIB element received, produce a feed-forward value.

11. The method of claim 10, wherein the outer transform matrix is an IUT Toeplitz matrix, and
  wherein the feed-forward computation circuit comprises a convolution circuit comprising a plurality of registers, multipliers, and adders, the convolution circuit configured in accordance with an impulse response, the impulse response being obtained from a first row of the IUT Toeplitz matrix.

12. The method of claim 11, wherein the outer encoder is further configured to use the feed-forward value together with a current element of the FDB or a current element of the OCB to generate a next element of the TIB and a next element of the TOB.

* * * * *